(12) United States Patent
Furukawa

(10) Patent No.: US 12,190,227 B2
(45) Date of Patent: Jan. 7, 2025

(54) ARITHMETIC PROCESSING DEVICE FOR PERFORMING IMAGE RECOGNITION

(71) Applicant: OLYMPUS CORPORATION, Hachioji (JP)

(72) Inventor: Hideaki Furukawa, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 1018 days.

(21) Appl. No.: 17/081,006

(22) Filed: Oct. 27, 2020

(65) Prior Publication Data

US 2021/0042616 A1 Feb. 11, 2021

Related U.S. Application Data

(63) Continuation of application No. PCT/JP2019/018565, filed on May 9, 2019.

(51) Int. Cl.
  *G06N 3/063* (2023.01)
  *G06F 17/15* (2006.01)
  *G06N 3/08* (2023.01)
  *G11C 11/413* (2006.01)

(52) U.S. Cl.
  CPC ............ *G06N 3/063* (2013.01); *G06F 17/15* (2013.01); *G06N 3/08* (2013.01); *G11C 11/413* (2013.01)

(58) Field of Classification Search
  None
  See application file for complete search history.

(56) References Cited

U.S. PATENT DOCUMENTS

| | | | | |
|---|---|---|---|---|
| 10,872,262 | B2 * | 12/2020 | Yano | G06V 40/10 |
| 11,507,804 | B2 * | 11/2022 | Bichler | G06N 3/048 |
| 2008/0291295 | A1 * | 11/2008 | Kato | H04N 19/17 |
| | | | | 382/254 |
| 2015/0309961 | A1 * | 10/2015 | Ozaki | G06F 17/15 |
| | | | | 706/16 |

(Continued)

FOREIGN PATENT DOCUMENTS

| JP | 2012-146032 A | 8/2012 |
|---|---|---|
| JP | 2016-099707 A | 5/2016 |

(Continued)

OTHER PUBLICATIONS

International Search Report dated Jul. 30, 2019, issued in counterpart application No. PCT/JP2019/018565, w/English translation (3 pages).

(Continued)

*Primary Examiner* — Haimei Jiang
(74) *Attorney, Agent, or Firm* — WHDA, LLP

(57) ABSTRACT

An arithmetic part of an arithmetic processing device includes: a filter processing part that has a multiplier and a first adder and performs filter processing; a second adder that performs cumulative addition processing that cumulatively adds all of the results of the filter processing as executed in N parallel; a non-linear conversion part that performs non-linear arithmetic processing on the result of the cumulative addition processing; a pooling processing part that performs pooling processing on the result of the non-linear arithmetic processing; and an arithmetic control part that controls the filter processing part, the second adder, the non-linear conversion part, and the pooling processing part.

7 Claims, 31 Drawing Sheets

(56) References Cited

U.S. PATENT DOCUMENTS

| | | | | |
|---|---|---|---|---|
| 2016/0125273 A1* | 5/2016 | Matsunaga | ........ | G06V 10/7715 |
| | | | | 382/159 |
| 2018/0268234 A1* | 9/2018 | Yang | .................... | G06F 18/2413 |
| 2019/0212982 A1* | 7/2019 | Yoda | ...................... | G06F 7/4876 |
| 2019/0266479 A1* | 8/2019 | Singh | .................... | G06N 3/0464 |
| 2020/0160118 A1* | 5/2020 | Kageyama | ............ | G06F 18/217 |
| 2020/0405152 A1* | 12/2020 | Hirano | ............... | G02B 23/2453 |

FOREIGN PATENT DOCUMENTS

| | | | |
|---|---|---|---|
| JP | 2017-021483 A | 1/2017 |
| JP | 2017-027314 A | 2/2017 |
| JP | 2018-028908 A | 2/2018 |

OTHER PUBLICATIONS

Li et al., "A High Performance FPGA-based Accelerator for Large-Scale Convolutional Neural Networks", Proceedings of 2016 26th International Conference on Field Programmable Logic and Applications (FPL), IEEE, online, Sep. 2, 2016, pp. 1 to 9, cited in ISR (10 pages).

* cited by examiner

FIG. 4A

DATA ARRANGEMENT

| a | b | c | d |
|---|---|---|---|
| e | f | g | h |
| i | j | k | l |
| m | n | o | p |

FIG. 4B

FILTER COEFFICIENT

| w1 | w2 | w3 |
|----|----|----|
| w4 | w5 | w6 |
| w7 | w8 | w9 |

FIG. 6A

FIRST SET
iFM

| a1 | b1 | c1 |
|----|----|----|
| d1 | e1 | f1 |
| g1 | h1 | i1 |

FIG. 6B

FIRST SET
COEFFICIENT

| w11 | w12 | w13 |
|-----|-----|-----|
| w14 | w15 | w16 |
| w17 | w18 | w19 |

FIG. 6C

SECOND SET
iFM

| a2 | b2 | c2 |
|----|----|----|
| d2 | e2 | f2 |
| g2 | h2 | i2 |

FIG. 6D

SECOND SET
COEFFICIENT

| w21 | w22 | w23 |
|-----|-----|-----|
| w24 | w25 | w26 |
| w27 | w28 | w29 |

FIG. 8

```
for (oFM V-DIRECTION LOOP) {
   for (oFM H-DIRECTION LOOP) {
      for (POOLING V-DIRECTION + FILTER V-DIRECTION LOOP) {
         for (POOLING H-DIRECTION + FILTER H-DIRECTION LOOP) {
            IBUF ADDRESS CALCULATION
            DATA RETRIEVING
            STORE IN FF ARRAY
         }
      }
      for (POOLING H-DIRECTION LOOP) {
         for (POOLING V-DIRECTION LOOP) {
            for (FILTER V-DIRECTION LOOP) {
               for (FILTER H-DIRECTION LOOP) {
                  RETRIEVING DATA FROM FF ARRAY
                  OUTPUT DATA
}}}}}}}
```

ARITHMETIC PROCESSING DEVICE FOR PERFORMING IMAGE RECOGNITION

CROSS REFERENCE TO RELATED APPLICATIONS

This application is a continuation application based on PCT Patent Application No. PCT/JP2019/018565, filed on May 9, 2019, whose priority is claimed on PCT Patent Application No. PCT/JP2018/018306, filed on May 11, 2018. The contents of both of the PCT Applications are incorporated herein by reference.

BACKGROUND

Technical Field

The present invention relates to an arithmetic processing device, and more particularly, to a circuit configuration of an arithmetic processing device that performs deep learning using a convolutional neural network.

Background Art

Conventionally, there is an arithmetic processing device that executes an arithmetic operation using a neural network in which a plurality of processing layers are hierarchically connected. In particular, deep learning using a convolutional neural network (hereinafter referred to as a CNN) is widely performed in an arithmetic processing device that performs image recognition.

FIG. 33 is a diagram showing the flow of one example of deep learning processing using a CNN. In image recognition by deep learning using a CNN, final arithmetic result data in which an object included in an image is recognized is obtained by sequentially performing processing in a plurality of processing layers of the CNN on input image data (pixel data). Image recognition by deep learning using the CNN can realize a high recognition rate.

Specifically, first, a combination (one processing layer) of convolution arithmetic processing (convolution processing), in which a feature map (FM) is generated by extracting a certain region from image data and multiplying it by a plurality of filters having different coefficients, and reduction processing (pooling processing), in which a partial area is extracted from the feature map, is performed multiple times (in a plurality of processing layers) on image data. These processes are processes of the convolution layer.

When the convolution processing proceeds and the FM is reduced to a certain extent, the image data is read as a one-dimensional data string. Full-connect processing is performed a plurality of times (in a plurality of processing layers) in which each data item of the one-dimensional data string is multiplied by a different coefficient and cumulative addition is performed. These processes are processes of the full-connect layer.

Then, after the full-connect processing, the probability that the object included in the image has been detected (the probability of subject detection) is output as the subject estimation result that is the final arithmetic result. In the example of FIG. 33, as the final arithmetic result data, the probability that a dog is detected is 0.01 (1%), the probability that a cat is detected is 0.04 (4%), the probability that a boat is detected is 0.94 (94%), and the probability that a bird is detected is 0.02 (2%).

In this way, the CNN processing layer is roughly classified into a convolution layer, which performs convolution processing including convolution arithmetic processing, non-linear processing, reduction processing (pooling processing), and the like, and a full-connect layer, which performs full-connect processing in which all inputs (pixel data) are multiplied by a coefficient for cumulative addition. However, there are convolutional neural networks that do not have a full-connect layer.

FIG. 34 is a diagram showing a flow of the convolution processing. First, one pixel of the input image data is extracted, filtered with different coefficients, and cumulatively added to obtain data corresponding to one pixel. This performed for all the pixels of the image data, and data corresponding to all the pixels is generated. Next, non-linear conversion and reduction processing (pooling processing) are performed on the generated data, to generate an output feature map (oFM).

Further, the output feature map (oFM) is used as an input feature map (iFM), and the above-mentioned convolution processing is repeated by performing filter processing with different coefficients. In this way, the convolution processing is performed a plurality of times to obtain the output feature map (oFM).

FIG. 35 is a diagram showing a flow of the full-connect processing. The same number of coefficients are prepared for a plurality of input data, the multiplication is performed, the multiplied ones are cumulatively added, and one output data is obtained through a non-linear arithmetic. By repeating this processing a plurality of times with different coefficients, a plurality of output data can be generated.

In the image recognition processing by deep learning using a CNN, the data unit to be handled differs for each processing layer of the CNN, so that it is difficult to optimize the processing part and memory. Therefore, image recognition by deep learning using a CNN is generally implemented by software processing using a high-performance PC (hardware) or GPU (graphics processing unit), or by a configurable device (circuit) such as FPGA (field programmable gate army).

In Japanese Unexamined Patent Application, First Publication No. 2016-99707 (hereinafter referred to as Patent Document 1) and Japanese Unexamined Patent Application, First Publication No. 2017-27314 (hereinafter referred to as Patent Document 2), a convolution arithmetic processing part that performs convolution processing is configured by arranging product-sum arithmetic groups in a two-dimensional array for higher speed, and this convolution arithmetic processing part is also used (shared) in full-connect processing, thereby reducing circuits for full-connect processing.

Japanese Unexamined Patent Application, First Publication No. 2012-146032 (hereinafter referred to as Patent Document 3) discloses an image memory control device that can efficiently perform image rotation processing and the like even on monochrome image data with few components even for color image data with many components while suppressing an increase in internal memory, in a state in which an image memory capable of burst transfer is used. Specifically, five input buffers of eight lines are formed for each of the five CMYKA components, and the image data of each component corresponding to the same area is read from this input buffer in blocks of 8×8 pixels. Then, these blocks are stored in continuous column addresses within the same row address by burst transfer.

In Patent Document 1 and Patent Document 2, part of the circuit (convolution arithmetic processing part) is controlled to be switched, so as to be shared by the convolution processing and the full-connect processing, under the assumption that the convolution processing (filter arithmetic processing) and the full-connect processing (matrix arithmetic processing) have different processing contents. That is, by controlling part of the circuit to be switched, the arithmetic process is changed to implement the convolution processing and the full-connect processing. However, only part of the circuit is shared by the convolution processing and the full-connect processing.

Therefore, the filter kernel size in the convolution arithmetic is fixed in the circuit. In Patent Document 1, a multi-parallel arithmetic by a systolic array is performed at high speed, but the filter size is determined by the size of the systolic array. The same applies to Patent Document 2. Further, in Patent Document 1, when performing a full-connect processing, in the case of a feature map having a fraction with respect to the filter kernel size, invalid pixel processing must be performed.

The CNN is a process for calculating one pixel of the oFM by inputting (the vicinity of) the same coordinate data of all the iFMs. Since a large amount of data and coefficients are input and output, it must be designed with due consideration given to the arrangement in the DRAM and the transfer efficiency. As a similar process, there are processes such as noise reduction for obtaining a single output frame by inputting a plurality of frames and image data compression (process for utilizing correlation between frames). However, these inputs at most several to several tens of frames. On the other hand, when considering FM as a frame (depending on the size of the network), a CNN may input several hundred to several thousand frames. Therefore, it is not possible to simply access the DRAM in the same data format as the similar processing.

Expanding the network in a CNN is synonymous with increasing the number of FMs. Since the FM is a data string having two-dimensional position information, the iFM can be considered as a "data string having independent elements for the number of iFMs at the coordinates (X, Y)". Taking "independent element"="dimension", it can be said that the iFM is a high-dimensional data string. For example, an RGB image is a three-dimensional data sting.

In Patent Document 3, an efficient data set is formed as a burst transfer by dividing a data string of a dimension (CMYKA) per element into blocks of 8×8 size which is a basic unit of processing. In addition, by using this block as a processing part and changing the data format within the processing part, it is possible to respond to image rotation at high speed.

On the other hand, since the dimension (=FM number) of data to be processed by the CNN is a high-dimensional data string of hundreds to thousands as described above, the basic unit of processing or one element itself can be the size of a burst transfer unit (or more). Further, the size and the number of dimensions of the frame change for each layer. In addition, a CNN may have a process called shortcut, and the format must be compatible with this.

SUMMARY

The present invention provides an arithmetic processing device capable of sharing an entire circuit in convolution processing and full-connect processing in image recognition by deep learning using a CNN. Further, the present invention provides an arithmetic processing part that can support shortcut processing and can maintain high DRAM transfer efficiency.

According to an aspect of the present invention, an arithmetic processing device for deep learning, which performs a convolution processing and a full-connect processing, includes: a data storage memory manager including a data storage memory configured to store input feature map data, and a data storage memory control circuit configured to control the data storage memory; a coefficient storage memory manager including a coefficient storage memory configured to store a coefficient, and a coefficient storage memory control circuit configured to controls the coefficient storage memory, a data input part configured to acquire the input feature map data from an external storage memory; a coefficient input part configured to acquire the coefficient from the external storage memory; a data output part configured to write output feature map data to the external storage memory; an arithmetic part configured to acquire, with a configuration of N parallel inputs and M parallel outputs (N, M≥1), the input feature map data from the data storage memory and the coefficient from the coefficient storage memory, to perform filter processing, cumulative addition processing, non-linear arithmetic processing, and pooling processing; and a controller configured to control the data storage memory manager, the coefficient storage memory manager, the data input part, the data output part, and the arithmetic part. The data storage memory manager acquires the input feature map data from the data storage memory. The coefficient storage memory manager refers to a status of the data storage memory manager, to acquire a coefficient corresponding to data, which is to be acquired from the data storage memory manager, from the coefficient storage memory. The data output part connects M parallel data output from the arithmetic part to output to the external storage memory. The arithmetic part includes: a filter processing part having a multiplier and a first adder configured to perform the filter processing; a second adder configured to perform the cumulative addition processing that cumulatively adds all results of the filter processing as executed in N parallels; a non-linear conversion part configured to perform the non-linear arithmetic processing on result of the cumulative addition processing; a pooling processing part configured to perform the pooling processing on result of the non-linear arithmetic processing; and an arithmetic control part configured to control the filter processing part, the second adder, the non-linear conversion part, and the pooling processing part. The arithmetic control part, during the full-connect process, controls the arithmetic part to perform a process of converting an input one-dimensional data string (the number of elements is n) into a data string of N faces of a predetermined size (Fx×Fy)(where n≤Fx×Fy×N, at least one of Fx and Fy is 2 or more), sets a filter size to the predetermined size (Fx×Fy), and controls the arithmetic part so that a size of the output feature map data is 1×1 and the number of elements is m, as an output one-dimensional data string (the number of elements is m).

In the arithmetic processing device, the data storage memory may include a buffer that stores a data set necessary for calculating one data after the pooling process, and the buffer stores the data read from the data storage memory.

In the arithmetic processing device, in a state in which at least one of the input feature map data and the coefficient input is zero, an arithmetic execution determination part may notify the filter processing part of an arithmetic through. In a state in which the arithmetic execution determination part notifies the arithmetic through, the filter processing part may stop arithmetic processing.

In the arithmetic processing device, the coefficient storage memory manager may include a data zero detection part configured to detect whether or not the input feature map data read from the data storage memory is zero. Of coefficient storage memories, only a coefficient storage memory in which the input feature map data read from the corresponding data storage memory is not zero may be accessed to acquire the coefficient. The arithmetic execution determination part may detect a portion where the coefficient is zero, and in a state in which logical sum of result thereof and result of the data zero detection part is zero, notify the filter processing part of the arithmetic through.

In the arithmetic processing device, the data storage memory manager, which is N parallel, may include: a coefficient zero detection part configured detect whether or not all N parallel coefficients are zero among N-M coefficients stored in the coefficient storage memory, to output a coefficient zero detection signal; and an SRAM read control part configured to acquire the input feature map data only from a data storage memory corresponding to a coefficient of which the coefficient zero detection signal is not zero among data storage memories. The arithmetic execution determination part may detect a portion where the input feature map data is zero, and in a state in which logical sum of result thereof and result of the coefficient zero detection part is zero, notifies the filter processing part of the arithmetic through.

In the arithmetic processing device, the external storage memory may store a high-dimensional data string that is a data string having one or more dimensional position information and higher-order elements at position thereof. The data input part may acquire the high-dimensional data string from the external storage memory by burst transfer, and transfer the acquired high-dimensional data string to the data storage memory manager. The data output part may collectively output data of the same coordinates output from the arithmetic part in a burst transfer unit as a high-dimensional data string. The data storage memory manager may include: an internal coordinate conversion part configured to convert the high-dimensional data string acquired by the data input part from the external storage memory into coordinates handled by the arithmetic part; a data storage memory write control part configured to generate a write control signal to the data storage memory based on the coordinates, the data storage memory; and a data storage memory read control part configured to receive necessary data from the data storage memory in a predetermined order in response to a request from the arithmetic part.

In the arithmetic processing device, the external storage memory may store a high-dimensional data string that is a data string having one or more dimensional position information and higher-order elements at position thereof. The high-dimensional data string stored in the external storage memory may be a feature map having dimensional coordinate information and a higher-order feature amount for each coordinate, and data amount corresponding to one coordinate may be one unit or more of a burst transfer amount. The data input part may calculate a read address for accessing the external storage memory based on the number of faces and coordinates of the input feature map, and acquire a high-dimensional data string from the external storage memory by burst transfer, to transfer the acquired high-dimensional data string to the data storage memory manager. The data output part may calculate a write address for accessing the external storage memory based on the number of faces and coordinates of the output feature map, and output data to the external storage memory by burst transfer.

The data storage memory manager may include: an internal coordinate conversion part configured to generate coordinates and supplementary information; and a data storage memory write control part configured to generate a write control signal to the data storage memory based on the supplementary information. The internal coordinate conversion part may count the high-dimensional data string, which has been acquired from the external storage memory by the data input part, by a predetermined method, to generate the supplemental information and the coordinates of the feature map. The data storage memory write control part may generate a write control signal and a write address for a write target data storage memory based on the supplementary information and the coordinates of the feature map.

According to the arithmetic processing device of each aspect of the present invention, in image recognition by deep learning using a CNN, not only part of the circuit is shared but the entire circuit can be shared by the convolution processing and the full-connect processing. Furthermore, it is possible to support the shortcut processing and maintain high DRAM transfer efficiency.

BRIEF DESCRIPTION OF THE DRAWINGS

FIGS. 4A and 4B are diagrams showing a data arrangement of an iFM (input feature map) and a coefficient corresponding to this data in the arithmetic processing device according to the embodiment of the present invention.

FIGS. 6A, 6B, 6C and 6D are diagrams showing data arrangements of an iFM (input feature map) in each set and coefficients corresponding to the data in the arithmetic processing device according to the embodiment of the present invention.

FIG. 8 is a diagram showing an example of a code for IBUF control during convolution when the FF array is installed in the arithmetic processing device according to the embodiment of the present invention.

DETAILED DESCRIPTION OF THE PREFERRED EMBODIMENT

First, the concept underlying the present invention will be described. In the present invention, the processing in the full-connect layer is regarded as a special convolution processing in which the size of the input feature map (iFM) is equal to the filter size, the size of the output feature map (oFM) is 1×1, and no pooling processing is performed. Based on this idea, the convolution processing and the full-connect processing are performed in exactly the same circuit. That is, as in the conventional technique, the entire circuit is shared by the convolution processing and the full-connect processing instead that only part of the circuit is shared.

The input (data string of the input feature map) of the Full-Connect layer is iFM[j] (the number of elements n, 0≤j<n), and the output (the data string of the output feature map) is oFM[i] (the number of elements m, m 0≤i<m), k[i][j] is a coefficient group for calculating oFM[i], and the following equation is satisfied.

(Equation 1)

$$oFM[i] = \sum_{j=0}^{n-1} iFM[j] \times k[i][j] \qquad (1)$$

$$= \sum_{j2=0}^{Fy-1} \sum_{j1=0}^{Fx-1} iFM[j2 \times Fx + j1] \times$$

$$k[i][j2 \times Fx + j1]$$

$$(n = Fx \times Fy, 0 \leq i < m)$$

Here, a process (n≤Fx×Fy×N) of reconverting the input one-dimensional data string (the number of elements n) into a data string of N faces of a predetermined size (Fx×Fy) is performed. Fx is the size of the data string in the x direction (horizontal direction), Fy is the size of the data string in the y direction (vertical direction), and at least one of Fx and Fy is 2 or more.

Accordingly, the one-dimensional data string in the full-connect layer can be considered as a one-dimensional or more data string. For example, the input iFM[j] of the Full-Connect layer is interpreted as a three-dimensional data string iFM[z][x][y] (0≤x<Fx, 0≤y<Fy, 0≤j<n, j=Fy×(z×Fx+x)+y). In addition, the coefficient group k[i][j] is interpreted as a four-dimensional data string k[i][z][x][y](0≤i<m, 0≤x<Fx, 0≤y<Fv, 0≤j<n, j=Fy×(z×Fx+x)+y).

Figure 1:
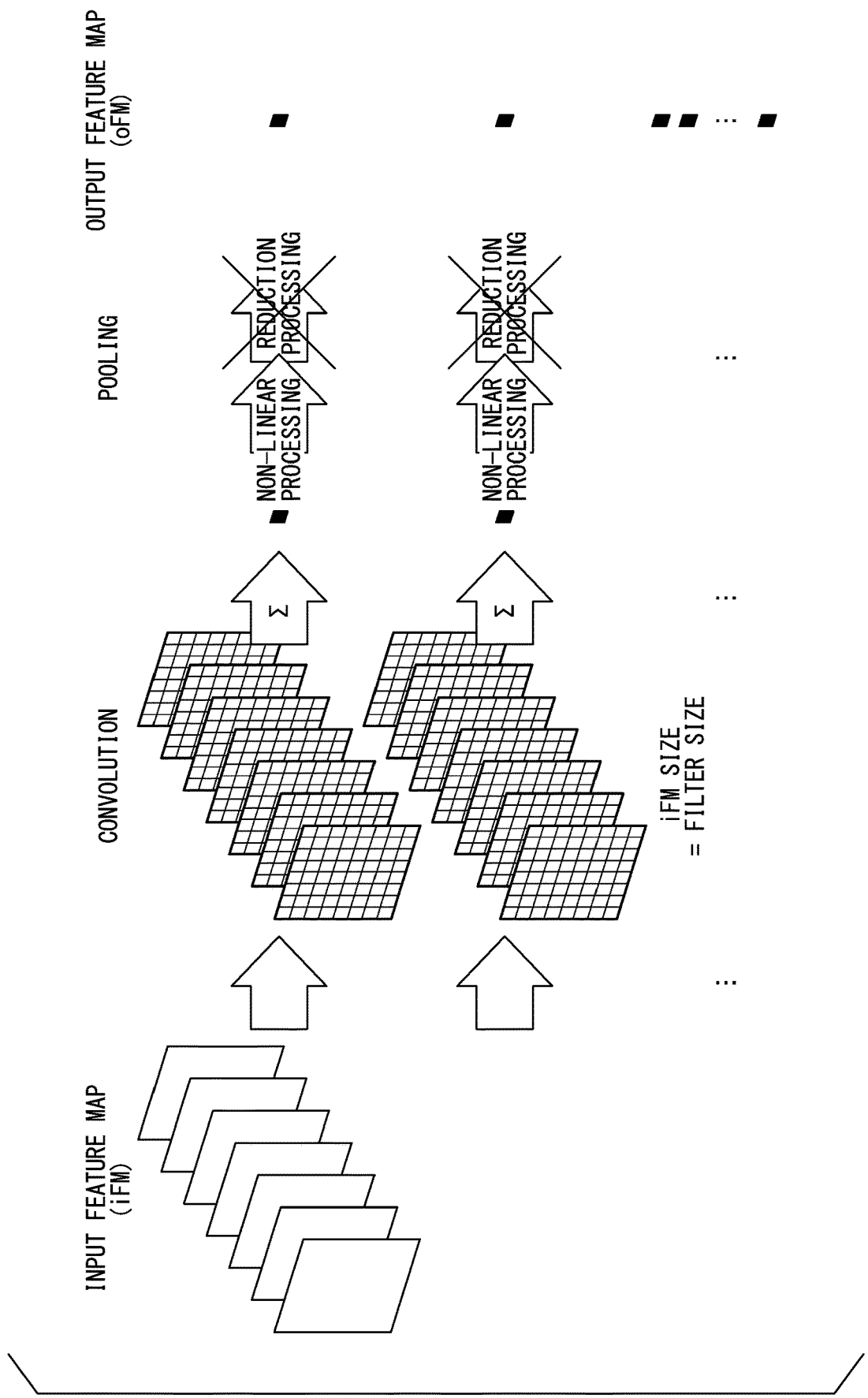
FIG. 1 is a diagram showing an interpretation of data in a fill-connect layer in an arithmetic processing device according to an embodiment of the present invention.
Figure 34:
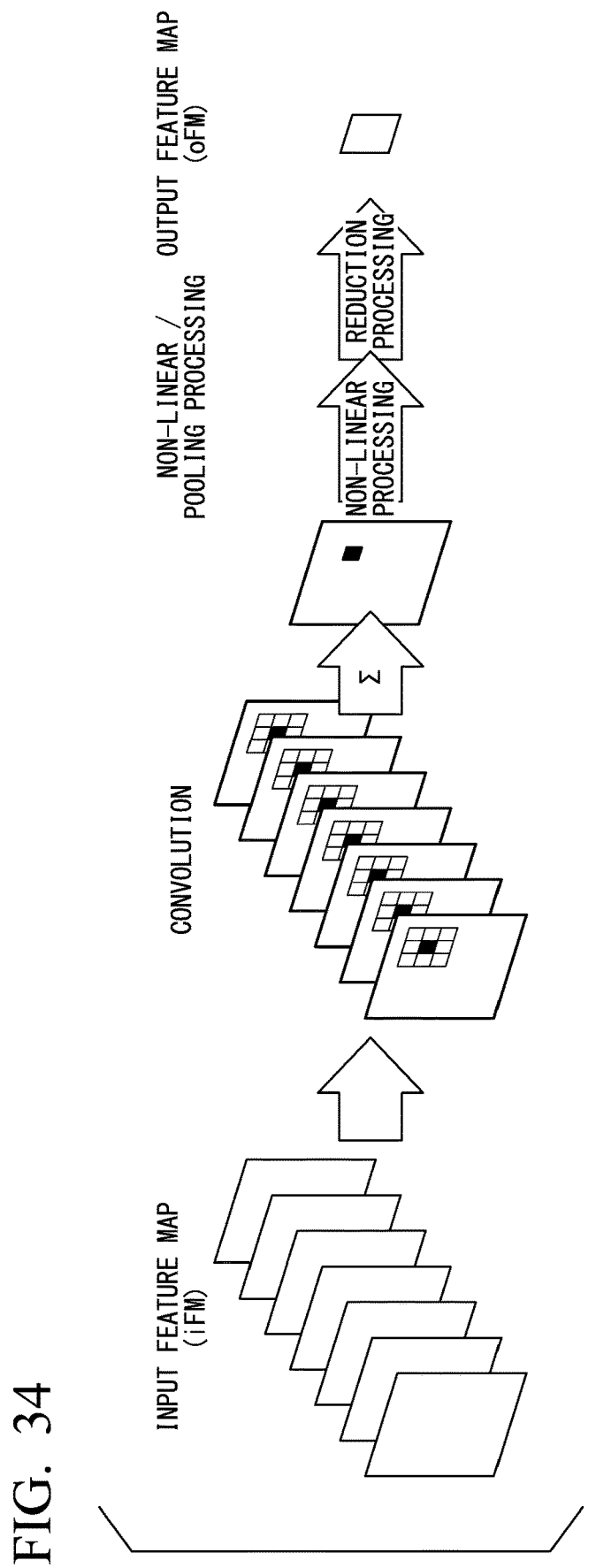
FIG. 34 is a diagram showing a flow of a convolution processing according to a conventional technique.
Figure 35:
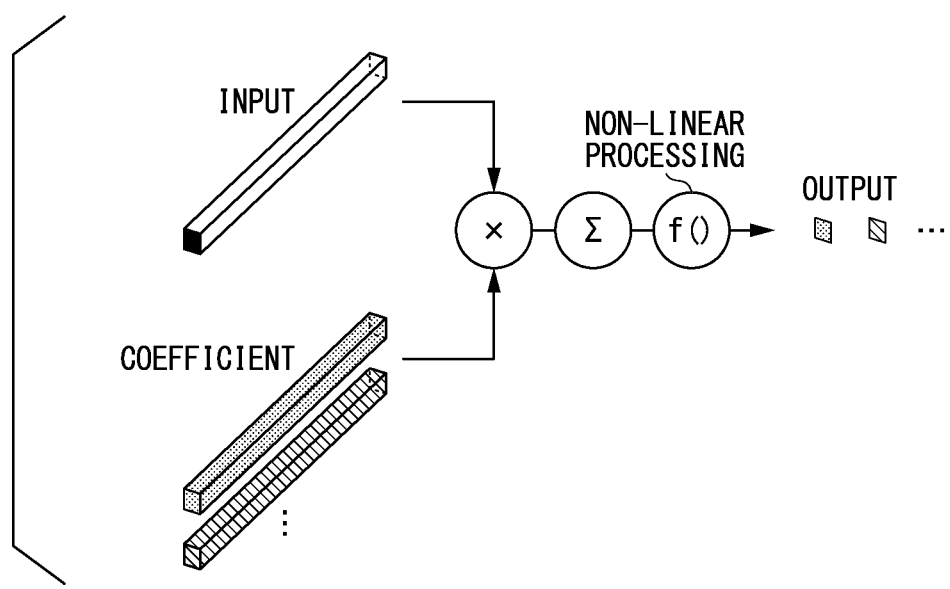
FIG. 35 is a diagram showing a flow of a full-connect processing according to a conventional technique.

FIG. 1 is a diagram showing an interpretation of data in a fill-connect layer according to an embodiment of the present invention. Compared with the processing in the convolution layer shown in FIG. 34, the difference is that the size of the input feature map (iFM) is equal to the filter size and pooling processing is not performed since the size of the output feature map (oFM) data is 1×1. In order to realize such interpretation of data in the full-connect layer, it is necessary that the filter size can be changed during the convolution processing and the full-connect processing, that is, the filter size must be variable.

Figure 2:
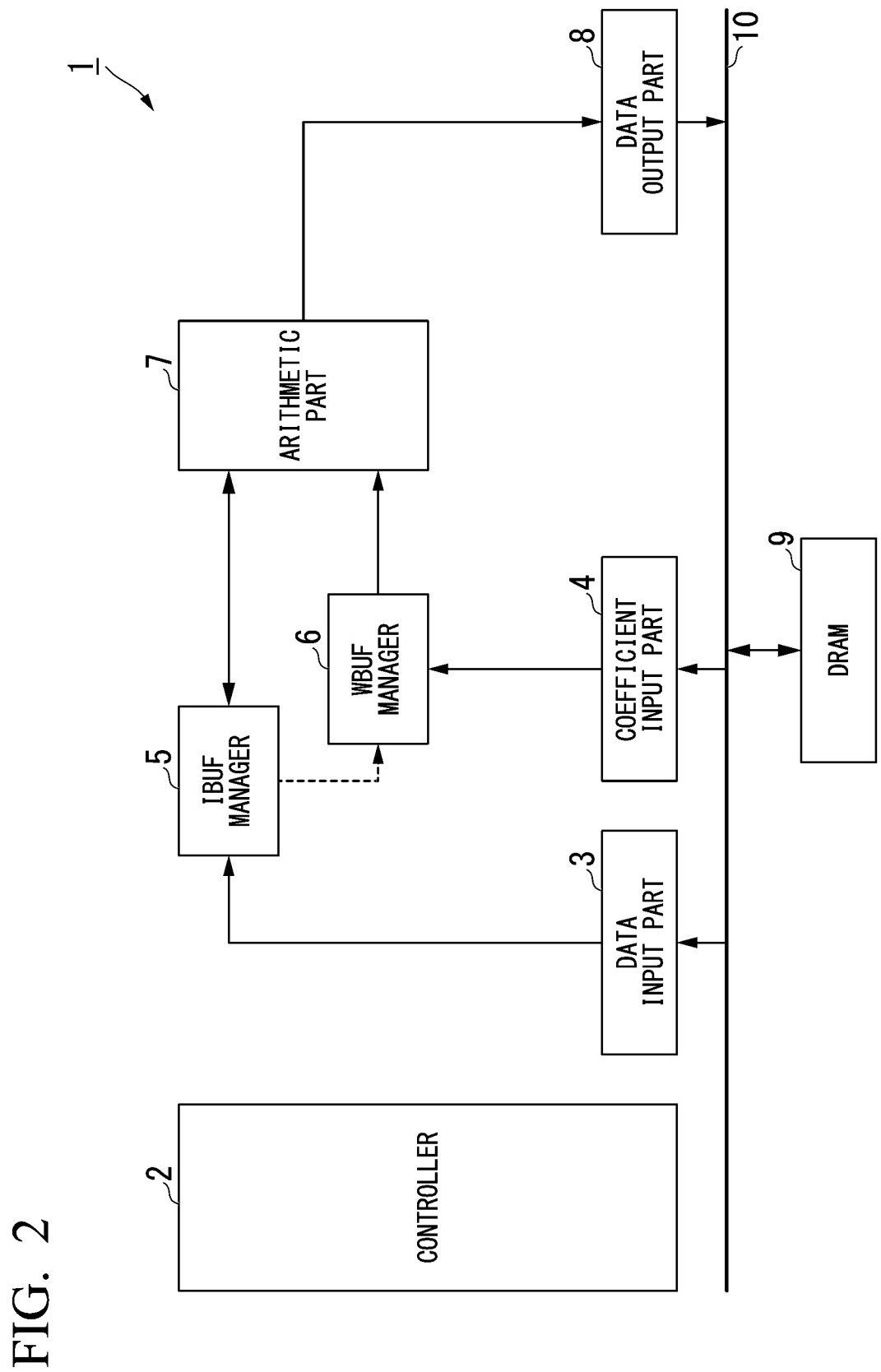
FIG. 2 is a block diagram showing a configuration of an arithmetic processing device for performing deep learning using a CNN in the arithmetic processing device according to the embodiment of the present invention.

FIG. 2 is a block diagram showing the configuration of an arithmetic processing part for performing deep learning using a CNN according to the embodiment of the present invention for realizing the interpretation of data in the above-mentioned full-connect layer.

The arithmetic processing device 1 includes a controller 2, a data input part 3, a coefficient input part 4, an IBUF (data storage memory) manager 5, a WBUF (coefficient storage memory) manager 6, an arithmetic part 7, and a data output part 8. The data input part 3, the coefficient input part 4, and the data output part 8 are connected to a DRAM (external storage memory) 9 via a bus 10.

The IBUF manager 5 has a memory (data storage memory IBUF) for storing input feature map (iFM) data, and a management/control circuit (data storage memory control circuit) for the data storage memory. The IBUF manager 5 counts the number of valid data in the input data to convert into a coordinate, further converts it into an IBUF address (iFM data) to store in the data storage memory, and extracts the iFM data from the data storage memory by a predetermined method.

The WBUF manager 6 has a coefficient storage memory (coefficient storage memory, WBUF) and a coefficient storage memory management/control circuit (coefficient storage memory control circuit). The WBUF manager 6 refers to the status of the IBUF manager 5, and extracts the coefficient corresponding to the data extracted from the IBUF manager 5 from the coefficient storage memory.

The DRAM (external storage memory) 9 stores iFM data, oFM data and coefficients. The data input part 3 acquires the input feature map (iFM) from the DRAM 9 by a predetermined method and transfers it to the IBUF (data storage memory) manager 5. The data output part 8 writes the output feature map (oFM) data to the DRAM 9 by a predetermined method. Specifically, the data output part 8 connects the M parallel data output from the arithmetic part 7 and outputs the connected data to the DRAM 9. The coefficient input part 4 acquires the coefficient from the DRAM 9 by a predetermined method and transfers it to the WBUF (coefficient storage memory) manager 6. The external storage memory 9 is not limited to DRAM, and may be SSD or the like.

The arithmetic part 7 acquires data from the IBUF (data storage memory) manager 5 and coefficients from the WBUF (coefficient storage memory) manager 6, and performs data processing such as filter processing, cumulative addition, non-linear arithmetic, and pooling processing. The controller 2 controls the entire circuit.

Figure 33:
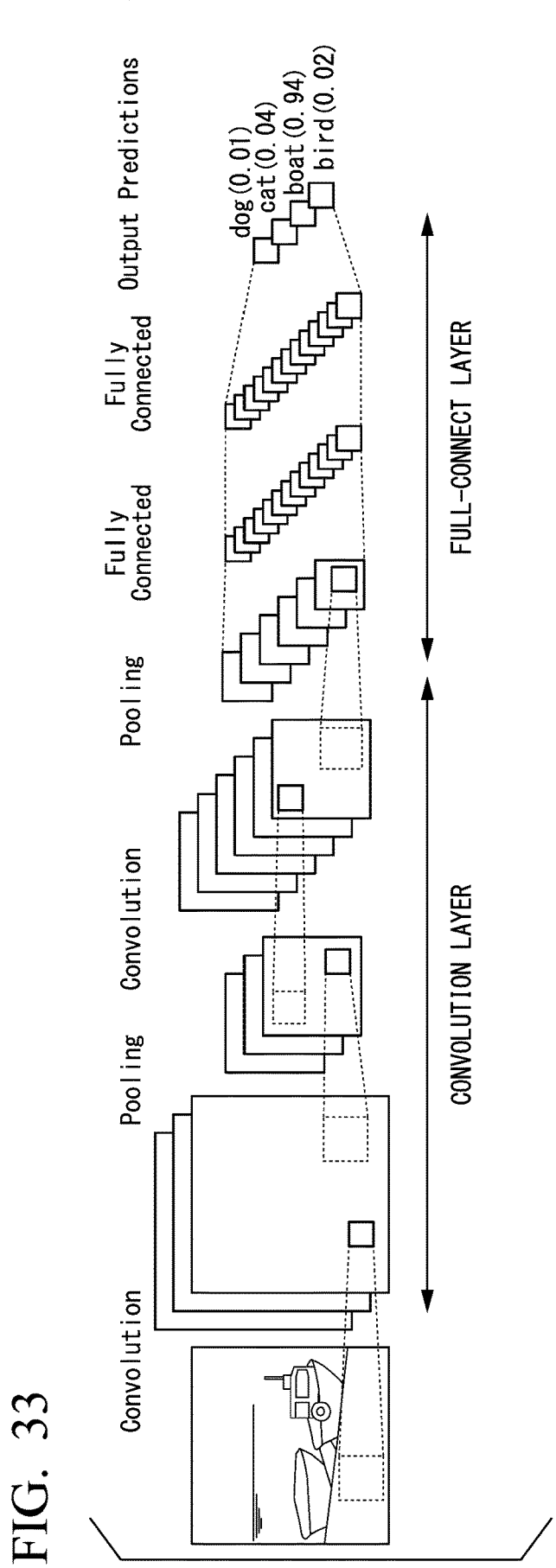
FIG. 33 is a diagram showing a flow of a deep learning process using a CNN.

In a CNN, as shown in FIG. 33, similar processing is performed for many layers. In a case in which the arithmetic processing device 1 according to the embodiment of the present invention is used, the arithmetic part 7 has only the data and coefficients necessary for the processing of one layer and performs the processing of one layer, and data and coefficients are placed in the DRAM 9 one by one. Then, the processing for the required number of layers is repeatedly executed. The arithmetic processing part 1 outputs the subject estimation result as final output data, and obtains the subject estimation result by processing the final output data using a processor (or a circuit).

Figure 3:
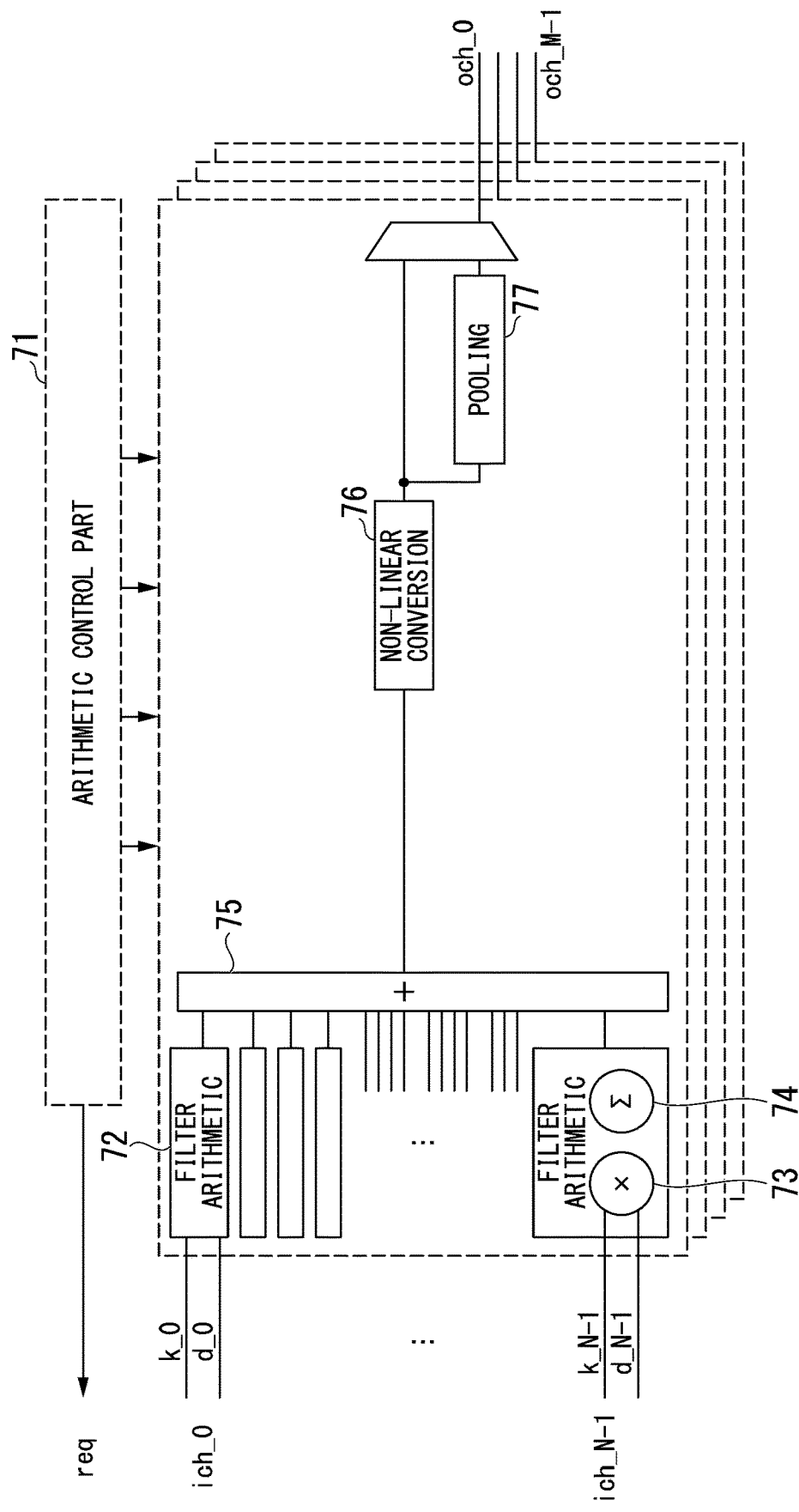
FIG. 3 is a diagram showing a configuration of an arithmetic part in the arithmetic processing device according to the embodiment of the present invention.

FIG. 3 is a diagram showing a configuration of an arithmetic part of the arithmetic processing device according to the embodiment of the present invention. The number of input channels of the arithmetic part 7 is N (N≥1), that is, the input data is N-dimensional, and N-dimensional input data is processed in parallel (input N parallel). The number of output channels of the arithmetic part 7 is M (M≥1), that is, output data is M-dimensional, and M-dimensional input data is output in parallel (output M parallel). As shown in FIG. 3, in one layer, iFM data ($d\_0$ to $d\_N-1$) and coefficients ($k\_0$ to $k\_N-1$) are input for each channel ($ich\_0$ to $ich\_N-1$), to output one data. This processing is performed in M layers in parallel, and M pieces of data $och\_0$ to $och\_M-1$ are output.

When pooling is performed, one piece of data is output only after data of "filter size×4" set is input. When no pooling is performed, one piece of data is output with data of "filter size" set.

As described above, the arithmetic part 7 has a configuration in which the degree of parallelism is N×M where the number of input channels is N and the number of output channels is M. Since the number of input channels N and the number of output channels M can be set (changed) according to the size of a CNN, they are appropriately set in consideration of processing performance and circuit scale.

The arithmetic part 7 includes an arithmetic control part 71 that controls each unit in the arithmetic part. Further, the arithmetic part 7 includes N filter processing parts 72, a second adder 75, a non-linear conversion part 76, and a pooling processing part 77 for each layer. There are M such layers. That is, there are N×M filter processing pets 72.

The arithmetic control part 71 issues a request to the preceding stage of the arithmetic part 7, whereby predetermined data is input to the filter processing part 72. The filter processing part 72 includes a multiplier 73 and a first adder 74, and filters input data. The multiplier 73 multiplies the FM data (feature map data) $d\_0$ to $d\_N-1$ input from the outside and the coefficients $k\_0$ to $k\_N-1$ input in synchronization with the FM data. Then, the first adder 74 cumulatively adds the multiplication results by the filter size, and the filter processing in the filter processing part 72 is completed. That is, the filter size is changed according to the number of cumulative additions. The N filter processing parts 72 perform the above-mentioned processing simultaneously (in parallel) on different FM data.

The second adder 75 cumulatively adds the results of the filter processing in the N filter processing parts 72 executed in N parallel. The non-linear conversion part 76 performs a non-linear arithmetic process using an Activate function or the like on the result of cumulative addition in the second adder 75. Although the specific implementation is not particularly specified, for example, non-linear arithmetic processing is performed by polygonal line approximation.

The pooling processing part 77 performs pooling processing such as selecting and outputting the maximum value (Max Pooling) from the plurality of data input from the non-linear conversion part 76 and calculating an average value (Average Pooling). Since the non-linear conversion part 76 and the pooling processing part 77 may not operate depending on the network, they can be passed through by the arithmetic control part 71. Since the pooling process is not performed during the full-connect process, the pooling processing part 77 is passed.

The arithmetic control part 71 controls the above-described processing performed in each unit in the arithmetic part 7. With such a configuration, the number of input channels N and the number of output channels M can be set (changed) according to the size of the CNN in the arithmetic part 7, so they are set appropriately in consideration of processing performance and circuit scale.

(During Convolution Processing)

During the convolution processing, the FM size and the filter size may be different and can be changed. The output is two-dimensional data.

The operation of the arithmetic part 7 during the convolution processing will be described. Here, it is considered that the convolution processing is focused on one input channel. The case where the filter size is 3×3 will be described below.

FIG. 4A is a diagram showing the data arrangement of the iFM (input feature map), and FIG. 4B is a diagram showing the coefficients corresponding to this data. Reference characters a to p in FIG. 4A indicate data values (corresponding to $d\_0$ to $d\_N-1$ in FIG. 3). Reference characters w1 to w9 in FIG. 4B indicate coefficient values (corresponding to k_0 to k_N−1 in FIG. 3). That is, d* indicates a data line and k* indicates a coefficient line.

Figure 5:
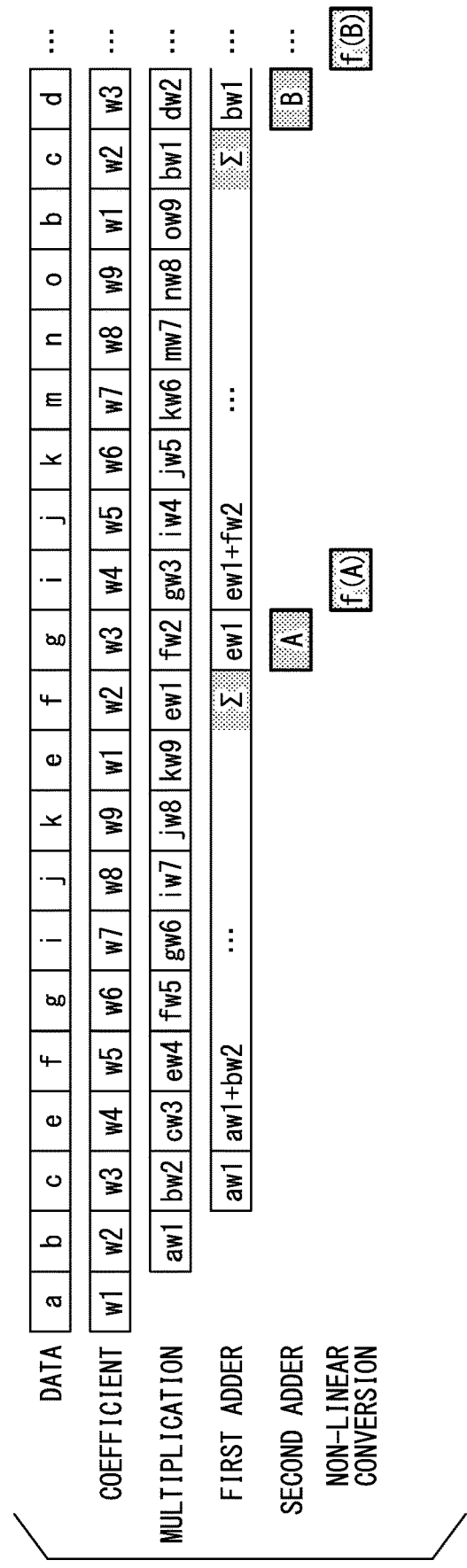
FIG. 5 is a diagram showing a timing chart during convolution processing in the arithmetic processing device according to the embodiment of the present invention.

FIG. 5 is a diagram showing a timing chart at the time of the convolution processing. Time will flow from left to right in the figure. First, for each of the data (a, b, c, e, f, g, i, j, k) of the filter size (3-3=9) in the iFM data shown in FIG. 4A, the multiplier 73 multiplies the coefficients w1 to w9. The first adder 74 cumulatively adds the multiplication result of the multiplier 73 for the filter size (9 of 3×3)(Σ in FIG. 5). The cumulative addition result (Σ) by the first adder 74 becomes the filter processing result in the filter processing part 72.

The second adder 75 sums the results (Σ) of the first adders 74 arranged in N parallels ("A" in FIG. 5). "A" corresponds to one pixel of output. In the second adder 75, the processing for obtaining the sum is performed at the timing when the filter processing result is output from the first adder 74. Then, the non-linear conversion part 76 performs the non-linear conversion on the sum (A) calculated by the second adder 75 ((A) in FIG. 5).

With the above, the processing of data corresponding to the filter size of one filter (3×3=9) is completed. Then, the process proceeds to processing the data of the filter size of the next filter (3×3=9). As shown in FIG. 5, the data input order is "a, b, c, e, f, g, i, j, k", followed by "e, f, g, i, j, k, in, n, o", followed by "b, c, d, f g, h, j, k, l". Thus, the position of the center of gravity of the filter moves in the order of "f→j→g→k" in the data shown in FIG. 4A. The non-linear conversion part 76 and subsequent parts are entered in this order, and the pooling processing part 77 performs pooling processing on a plurality of data.

(During Full-Connect Processing)

During the full-connect processing, a certain condition is added to the conditions of the FM size and the filter size during the convolution processing. At the time of the full-connect processing, the arithmetic part 7 performs a process of reconverting the input one-dimensional data string (the number of elements n) into two-dimensional data string of N faces of Fx×Fy (N parallel)(n≤Fx×Fy×N). That is, the arithmetic part 7 sets the filter size to a predetermined size (Fx×Fy), and sets so that the size of oFM is 1-n and the number of oFM is m as the output two-dimensional data string (the number of elements i×j). It does not need to be the same as the filter size at the time of convolution processing. N is the degree of input parallelism of the circuit and is fixed by the implementation. Therefore, in order to handle a large n, normally Fx and Fy are set to be as large as possible (within a compatible range).

The operation of the arithmetic part 7 during the full-connect processing will be described. Similar to the description of the convolution processing, the case where the filter size is 3-3 will be described. In this case, since the number of input channels is N (N parallel), the input data string is 9N. The size of the iFM data is 3×3 because it is the same as the filter size. That is, the above-mentioned Fx and Fy satisfy Fx=Fy=3. Therefore, the input (data string of the input feature map) iFM[j] (the number of elements n, $0 \leq j < n$) of the full-connect layer is interpreted as a three-dimensional data string iFM[z][x][y]($0 \leq x < 3$, $0 \leq y < 3$, $0 \leq j < n$, $j=3 \times (z \times 3 + x) + y$). Also, the coefficient group k[i][j] for calculating the output (data string of the output feature map) oFM[i](the number of elements m, $0 \leq i < m$) of the full-connect layer is interpreted as a four-dimensional data string k[i][z][x][y] ($0 \leq i < m$, $0 \leq x < 3$, $0 \leq y < 3$, $0 \leq j < n$, $j=3 \times (z \times 3 + x) + y$).

FIG. 6A is a diagram showing the data arrangement of the iFM (input feature map) in the first set, and FIG. 6B is a diagram showing the coefficients corresponding to this data. In FIG. 6A, a1 to i1 indicate data values, and in FIG. 6C, w11 to w19 indicate coefficient values. Similarly, FIG. 6C is a diagram showing the data arrangement of the iFM (input feature map) in the second set, and FIG. 6D is a diagram showing the coefficients corresponding to this data. In FIG. 6B, a2 to i2 indicate data values, and in FIG. 6D, w21 to w29 indicate coefficient values. The same applies to the third and subsequent sets, and the number of sets may be increased as necessary.

Figure 7:
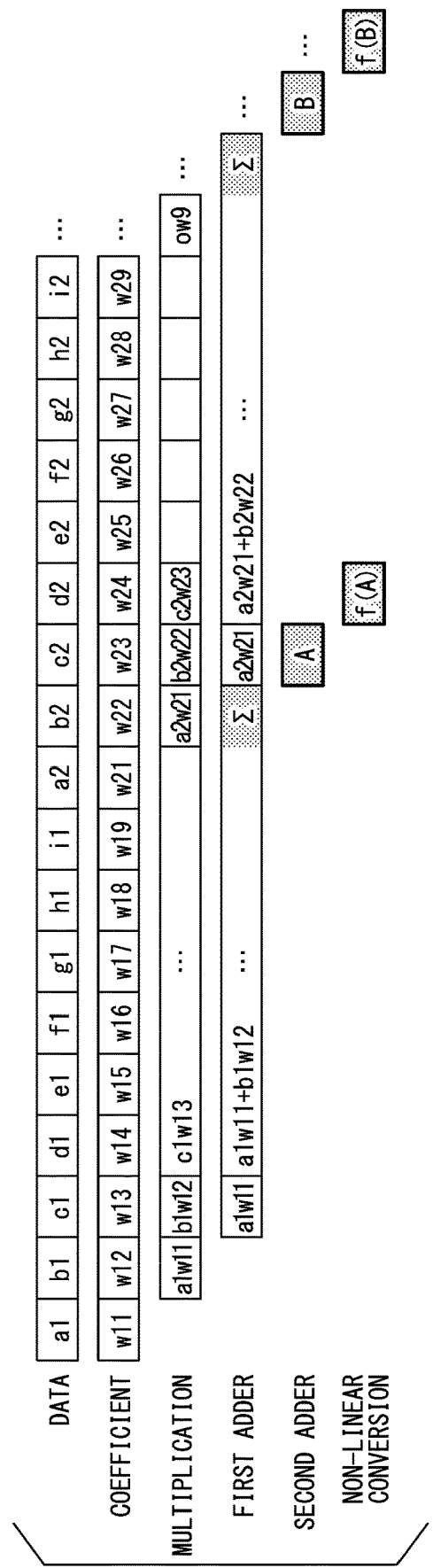
FIG. 7 is a diagram showing a timing chart at the time of fill-connect processing in the arithmetic processing device according to the embodiment of the present invention.

FIG. 7 is a diagram showing a timing chart at the time of full-connect processing. Considering the difference in the input data between FIGS. 4A, 4B and FIGS. 6A to 6D, the timing chart during the full-connect processing shown in FIG. 7 is the same as the timing chart during the convolution processing shown in FIG. 5. Therefore, the description of FIG. 7 is omitted. In the processing after this timing chart, the non-linear conversion output at the time of the convolution processing shown in FIG. 5 is the data of one pixel forming the oFM (more accurately, the pooling processing for generating the data of one pixel forming the oFM), while the non-linear conversion output at the time of fill-connect processing shown in FIG. 7 is the oFM data of one face as it is.

Here, in a case in which the input data string is not exactly divisible by the filter size, by adding data with a value of zero so that it is divisible by the filter size (equal to the filter size), arithmetic can be performed without causing an error in the cumulative addition result.

As described above, the present invention can cope with an arbitrary filter size only by changing the setting parameter, and realizes a configuration in which high speed performance is realized by arranging in parallel in an array shape in the filter type direction, not in the filter size direction, and the filter size can be set (changed). As a result, the completely same circuit can handle both convolution processing and full-connect processing, does not require dedicated control, and has an effect of scale reduction (power reduction). In addition, since the filter size is variable, it is highly convenient. Further, since the circuit resources of the convolution processing can be fully utilized in the full-connect processing, the full-connect processing can be executed at high speed.

During the convolution processing, as shown in the timing chart of FIG. 5, the same data is read from the data storage memory (IBUF) multiple times. Specifically, in the data shown in FIG. 4A, nine pieces of data centered on "f are read out to calculate one output data, nine pieces of data centered on j" are read out to calculate one output data, nine pieces of data centered on "g" are read out to calculate one output data, and nine pieces of data centered on "k" are read out to calculate one output data. Then, one data is calculated from the four (2×2) data by the pooling processing. That is, in a case in which the filter size is 3-3 and the size of the unit of executing the pooling processing is 2×2, the number of types of data read from the data storage memory is 16, and the number of times of reading is 3-3×4=36.

Therefore, in order to reduce the power consumption for accessing the SRAM of the data storage memory, an FF array (buffer) for extracting and storing the data from/to the data storage memory in units of 4×4 shown in FIG. 4A may be provided inside the data storage memory. That is, the data storage memory includes an FF array that can store a data set (4×4=16 pieces of data) necessary to calculate one data after the pooling processing, and this FF array accumulates the data read from the IBUF. With such a configuration, it is not necessary to read the same data from the SRAM many times, and it is possible to reduce memory access and power consumption.

FIG. 8 is a diagram showing an example of the IBUF control code at the time of Convolution in a case in which the FF array is installed. The equivalent function may be implemented by a circuit.

(Modification)

A modified example of the above embodiment will be described. In the present invention, as shown in FIG. 3, the filter operation is realized by multiplying the data and the coefficient in pixel units and cumulatively adding the multiplication results by the cumulative adder. At this time, in a case in which at least one of the coefficient and the data is zero, the multiplication result is zero, and the result of the cumulative addition is not updated, so that the arithmetic is wasted. Especially, in deep leaning, many of the coefficients may be zero, and this problem is remarkable.

Figure 9:
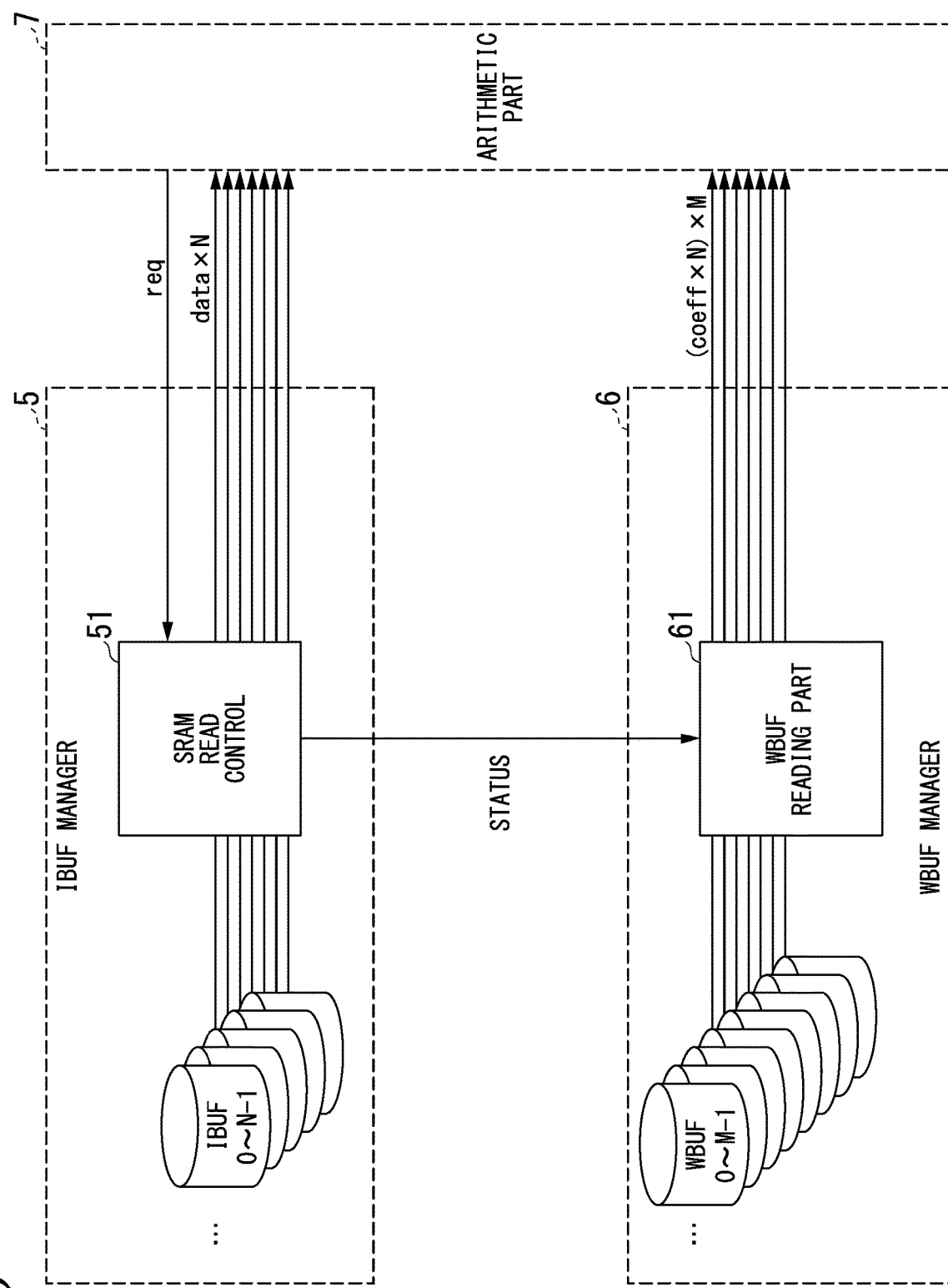
FIG. 9 is a diagram showing a connection of an IBUF manager, a WBUF manager, and an arithmetic part in an arithmetic processing device according to a first modification of the embodiment of the present invention.

Therefore, in the first modification, in a case in which either the coefficient or the data is zero, the power consumption is reduced by not performing the multiplication and the cumulative addition. FIG. 9 is a diagram showing a connection of the IBUF manager 5, the WBUF manager 6, and the arithmetic part 7 according to the arithmetic processing device of the present modification.

Upon receiving the request (req) from the arithmetic part 7, the SRAM read control part 51 of the IBUF (data storage memory) manager 5 reads N FM data from the N IBUFs (0 to N−1) and transmits them to the arithmetic part 7. Also, at the same timing as this, the WBUF reading part 61 of the WBUF (coefficient storage memory) manager 6 reads N-M coefficients from M WBUFs (0 to M−1) and transmits them to the arithmetic part 7. In this modification, a status signal is transmitted from the SRAM read control part 51 of the IBUF manager 5 to the WBUF reading part 61 of the WBUF manager 6. Here, the status signal is a signal that informs the WBUF manager 6 of the FM data extracted by the IBUF manager 5.

Figure 10:
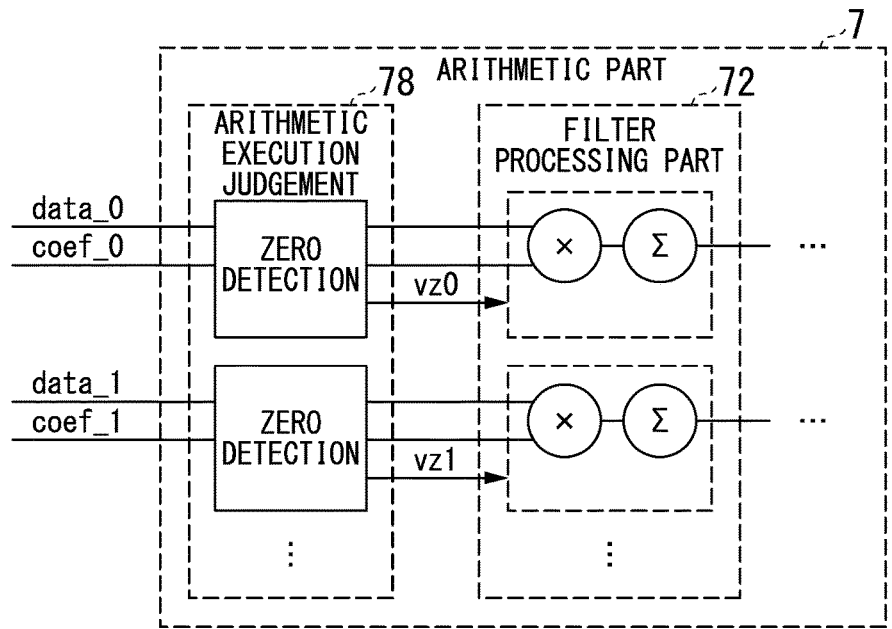
FIG. 10 is a diagram showing an internal configuration of the arithmetic par in the arithmetic processing device according to the first modified example of the embodiment of the present invention.

FIG. 10 is a diagram showing an internal configuration of the arithmetic part 7 in FIG. 9. In this modified example, in the arithmetic part 7, the arithmetic execution determination part 78 is provided before the filter processing part 72. The arithmetic execution determination part 78 notifies the filter processing part 72 of the arithmetic through signals (vz_0, vz_0, ... vz_1, ... ), which indicates whether one of the data (data_0, data_1, ... ) input from the IBUF and the coefficient (coef_0, coef_1, ... ) input from the WBUF is zero or not.

In a case in which either of the data (data_0, data_1, ... ) input from the IBUF and the coefficient (coef_0, coef_1,... ) input from the WBUF is zero, the value of the arithmetic through signal (vz_0, vz_1,... ) is zero. In a case in which both the data (data_0, data_1, ... ) input from the IBUF and the coefficients (coef_0, coef_1, ... ) input from the WBUF are not zero, the value of the arithmetic through signal (vz_0, vz_1, ... ) is 1.

In a case in which the value of the arithmetic through signal (vz_0, vz_1, ... ) input from the arithmetic execution determination part 78 is zero, the filter processing part 72 turns off the execution of multiplication and cumulative addition (arithmetic through). The "arithmetic through" means that the processing in the filter processing part 72 is stopped or the arithmetic processing is not performed.

Figure 11:
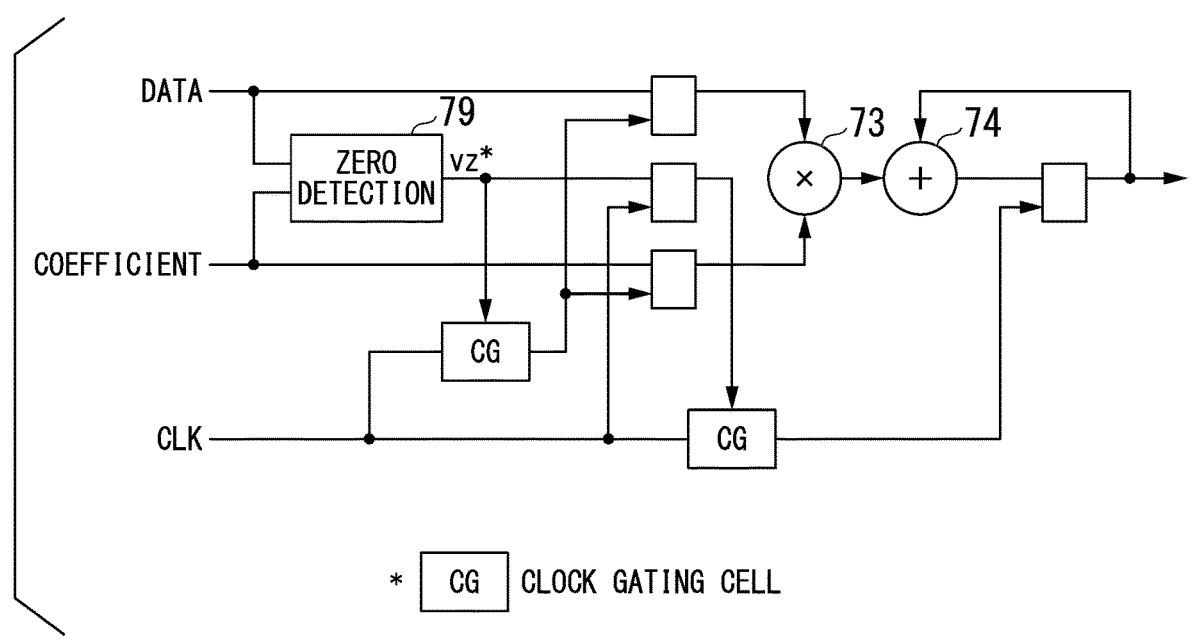
FIG. 11 is a diagram showing an example of arithmetic through by clock gating in the arithmetic processing device according to the first modified example of the embodiment of the present invention.

The arithmetic through signals (vz_0, vz_1, ... ) may be enable signals or may be used to gate (stop) the clock input to the filter processing part 72. FIG. 11 is a diagram showing an example of arithmetic through by clock gating. "CG" in the figure indicates a clock gating cell. When the zero detection part of the arithmetic execution determination part 78 detects zero of the data (data) or the coefficient (coef), the value of the arithmetic through signal (vz_0, vz_1, ... ) is set to zero and is notified to the clock gating cell. In a case in which the value of the arithmetic through signal (vz_0, vz_1, ... ) is zero, the clock gating cell transmits a signal to stop the clock and the arithmetic in the filter processing part 72 is stopped.

Figure 12:
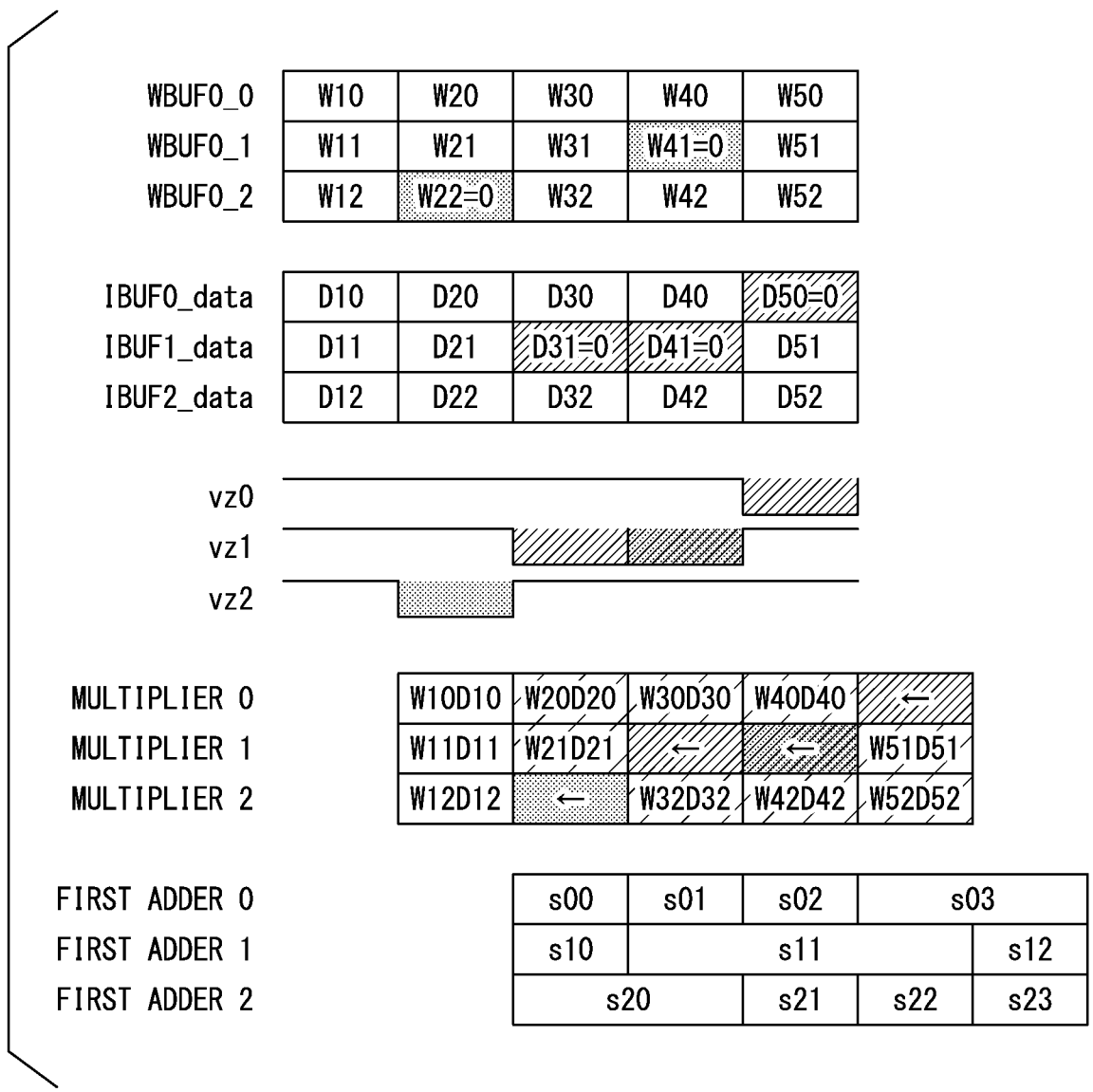
FIG. 12 is a diagram showing a timing chart at the time of arithmetic in the arithmetic processing device according to the first modified example of the embodiment of the present invention.

FIG. 12 is a diagram showing a timing chart where the parallel degree of input is N=n+1=2 and the parallel degree of output is M=m+1=2. In a case in which the coefficient value (W) in WBUF (coefficient storage memory) or the data value (D) in IBUF (data storage memory) is zero, the value of the arithmetic through signal (vz_0, vz_1, ... ) becomes zero and the arithmetic in the multiplier is passed through, and the operation by the first adder is passed through.

In this way, in a case in which at least one of the input feature map data and the coefficient is zero, the arithmetic execution determination part 78 notifies the filter processing part 72 of the arithmetic through. In a case in which the arithmetic execution determination part 78 notifies the arithmetic through, the filter processing part 72 skips the arithmetic. With such a configuration, in the first modification, in a case in which either the coefficient or the data is zero, the power consumption can be reduced by not performing the multiplication and the cumulative addition.

Next, a second modification of the embodiment of the present invention will be described. In the second modification, in a case in which there are many zeros in the data, the data is read first, and when the data is zero, the access to the coefficient storage memory (SRAM read access) itself is stopped. This further reduces power consumption.

Figure 13:
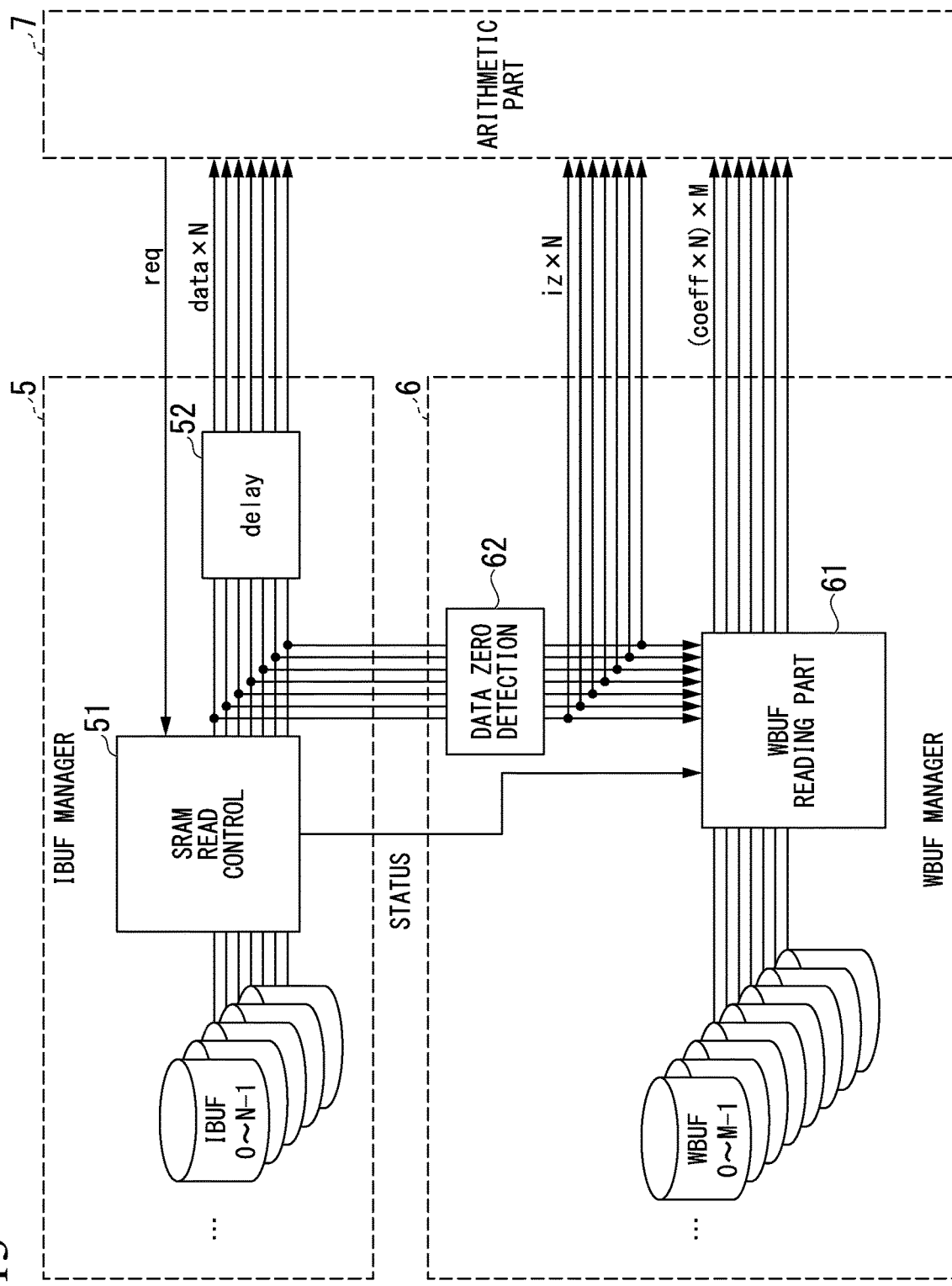
FIG. 13 is a diagram showing a connection of an IBUF manager, a WBUF manager, and an arithmetic part in an arithmetic processing device according to a second modification of the embodiment of the present invention.

FIG. 13 is a diagram showing the connection of the IBUF manager 5, the WBUF manager 6, and the arithmetic part 7 according to the arithmetic processing device of the present modification. Upon receiving the request (req) from the arithmetic part 7, the SRAM read control part 51 of the IBUF (data storage memory) manager 5 reads N FM data from the N IBUFs (0 to N−1) and transmits them to the arithmetic part 7 via the delay circuit 52 and transmits them to the data zero detection part 62 of the WBUF (coefficient storage memory) manager 6.

The data zero detection part 62 detects whether or not each of the N FM data transmitted from the IBUF manager 5 is zero, and when the data is zero, the detection signal iz*=0 (*=0 to N−1). For example, if the FM data read from IBUF0 is zero, iz0=0. Then, the data zero detection part 62 transmits the detection signal iz* to the WBUF reading part 61 and the arithmetic part 7 of the WBUF (coefficient storage memory) manager 6.

Based on the detection signal iz*, the WBUF reading part 61 of the WBUF (coefficient storage memory) manager 6 accesses only the WBUF of which the corresponding data is not zero among the M WBUFs (0 to M−1) to read out the coefficient and transmits them to the arithmetic part 7. The coefficient that has not accessed the WBUF (not read from the WBUF) is set to zero and transmitted to the arithmetic part 7.

Figure 14:
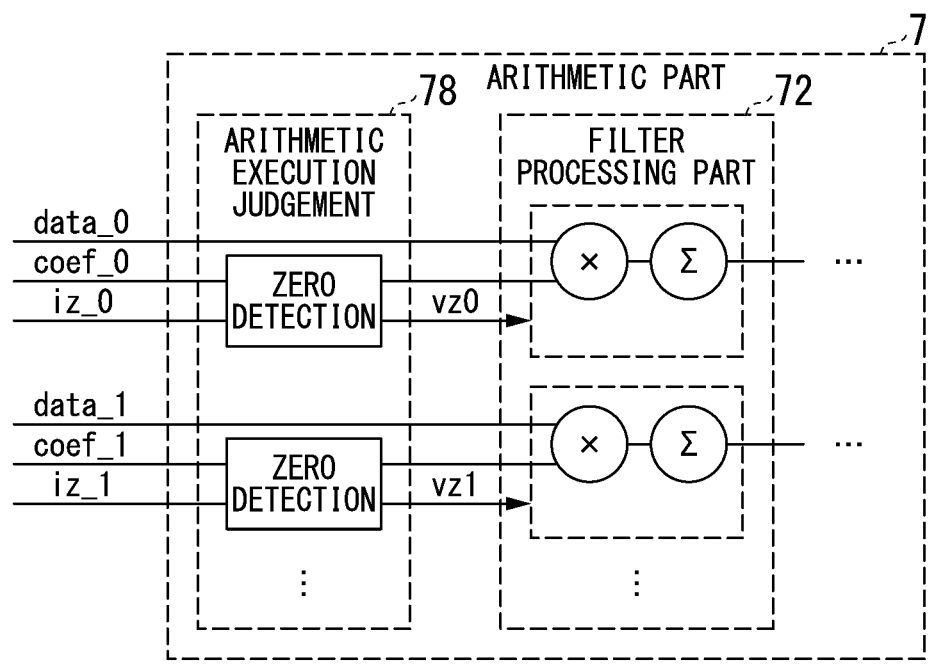
FIG. 14 is a diagram showing an internal configuration of the arithmetic part in the arithmetic processing device according to the second modification of the embodiment of the present invention.

FIG. 14 is a diagram showing an internal configuration of the arithmetic part 7 in the present modification. The arithmetic execution determination part 78 of the arithmetic part 7 detects a portion in which the coefficients (coef_0, coef_1, ... ) transmitted from the WBUF reading part 61 are zero, and uses the logical sum of the detection result and the detection signal (iz_0, iz_1, . . . ) transmitted from the data zero detection part 62 as the arithmetic through signal (vz0, vz1, . . . ).

Figure 15:
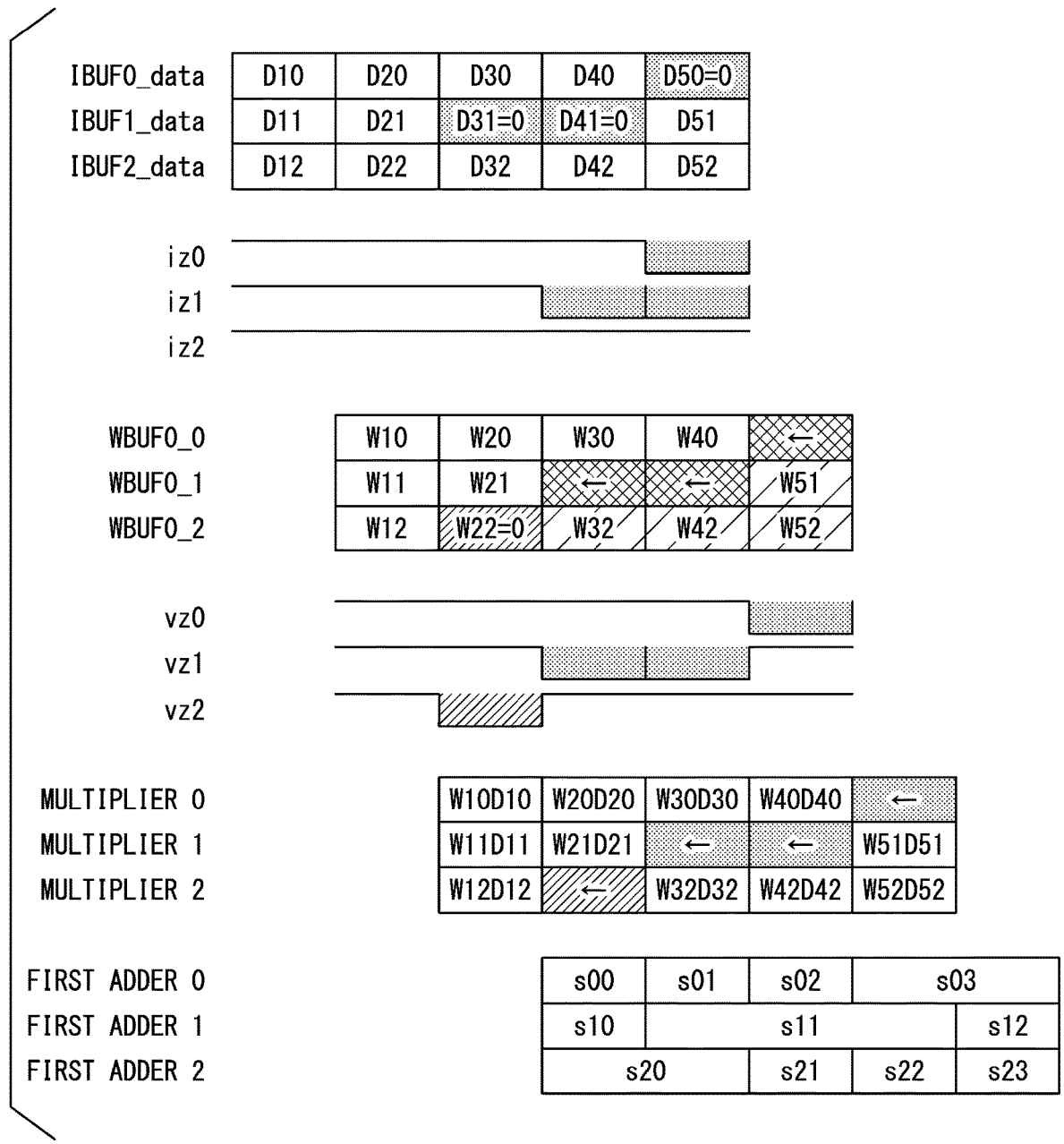
FIG. 15 is a diagram showing a timing chart at the time of arithmetic in the arithmetic processing device according to the second modified example of the embodiment of the present invention.

FIG. 15 is a diagram showing a timing chart at the time of arithmetic in the present modification. In a case in which the data value (D) in the IBUF (data storage memory) is zero, the value of the detection signal (iz_0, iz_1, . . . ) is zero, and the coefficient is not read from the corresponding WBUF ("←" in the figure). Then, in a case in which the arithmetic through signal (vz0, vz1, . . . ) based on the detection result of zero in the data value (D) in IBUF (data storage memory) and the detection result of zero in the coefficient value (W) in WBUF (coefficient storage memory) is zero, the arithmetic in the multiplier 73 of the filter processing part 72 is passed through ("←" in the figure). The final result obtained is the same as that of the first modification.

As described above, in this modification, the WBUF manager 6 has the data zero detection part 62 that detects whether the FM data read from the IBUF (data storage memory) is zero. Then, the WBUF reading part 61 of the WBUF (coefficient storage memory) manager 6 accesses only WBUF in which FM data read from the corresponding IBUF (data storage memory) among the WBUF (coefficient storage memory) is not zero to extract the coefficient. Further, the arithmetic execution determination part 78 of the arithmetic part 7 detects the portion where the coefficient is zero and outputs the logical sum of the detection result and the result of the data zero detection part.

With such a configuration, in the second modified example, in addition to the first modified example, in a case in which the data is zero, the access itself to the coefficient storage memory can be stopped to further reduce the power consumption. The second modification is advantageous in a case in which the data has many zeros.

Next, a third modified example of the embodiment of the present invention will be described. In the third modification, in a case in which there are many zeros in the coefficient, the coefficient is read first and only the IBUF corresponding to the portion where the value of the coefficient is not zero is accessed. That is, the data read access itself corresponding to the portion where the coefficient value is zero is stopped.

Figure 16:
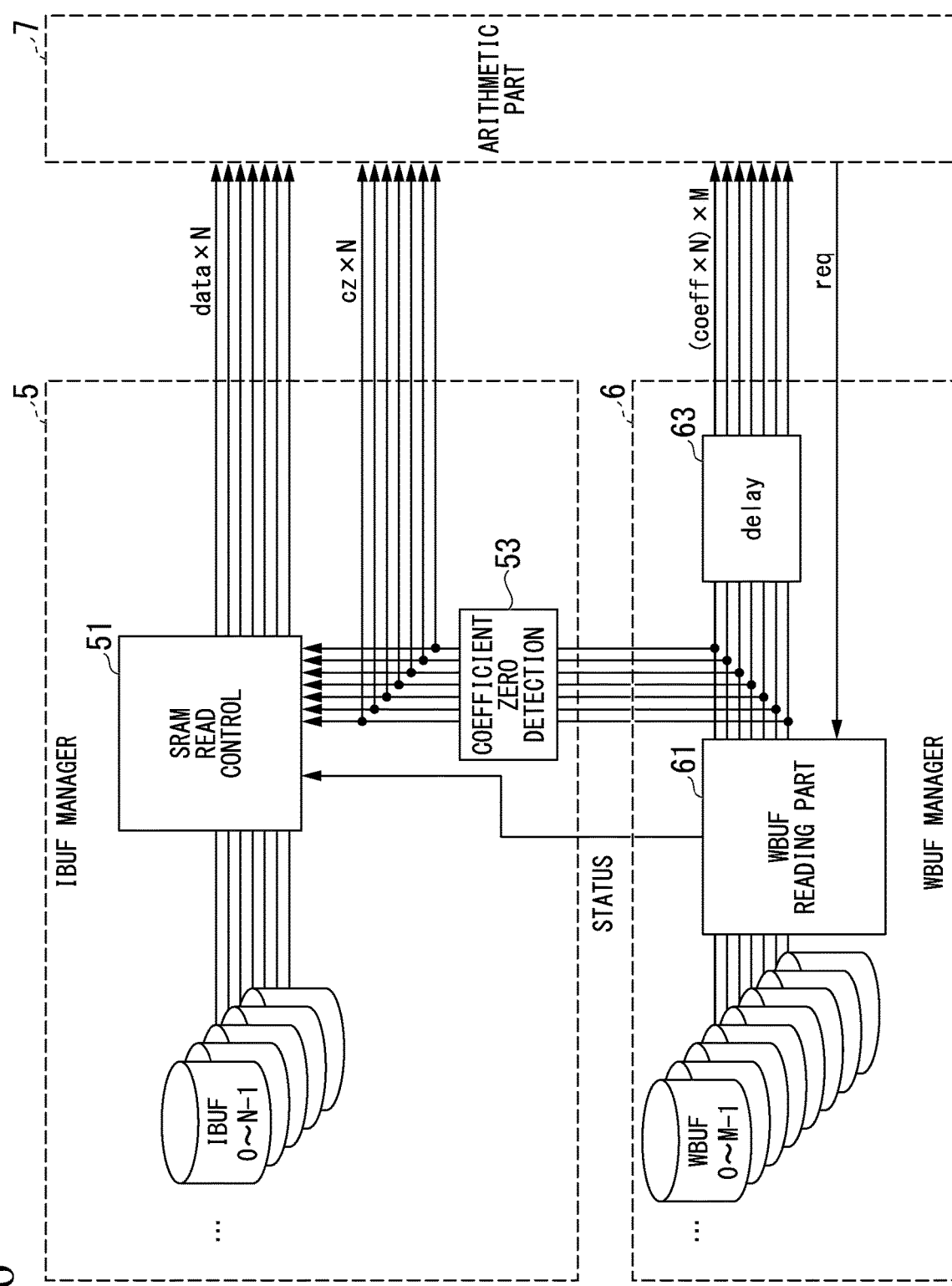
FIG. 16 is a diagram showing a connection of an IBUF manager, a WBUF manager, and an arithmetic part in an arithmetic processing device according to a third modification of the embodiment of the present invention.

FIG. 16 is a diagram showing a connection of the IBUF manager 5, the WBUF manager 6, and the arithmetic part 7 according to the arithmetic processing device of the present modification. Upon receiving the request (req) from the arithmetic part 7, the WBUF reading part 61 of the WBUF (coefficient storage memory) manager 6 accesses M WBUFs (0 to M−1) to obtain N×M coefficients and transmits them to the arithmetic part 7 via the delay circuit 63, and at the same time, transmits them to the coefficient zero detection part 53 of the IBUF (data storage memory) manager 5. Further, the WBUF reading part 61 transmits a status signal to the SRAM reading control part 51 of the IBUF (data storage memory) manager 5. Here, the status signal is a signal for transmitting information of the coefficient extracted by the WBUF manager 6 to the IBUF manager 5.

The coefficient zero detection part 53 detects whether or not each of the NAM coefficients transmitted from the WBUF manager 6 is zero, and, in a case in which all the M parallel coefficients (M coefficients) are zero, sets as the coefficient zero detection signal cz*=(*=0 to N to 1). For example, in a case in which the coefficients read from all WBUF0 of M parallel are zero, cz0=0. In this way, the IBUF manager 5 shares the output of the IBUF in M parallels, so it is necessary to detect whether or not all the coefficients (M coefficients) in M parallel are zero.

Then, the coefficient zero detection part 53 transmits the coefficient zero detection signal cz* to the SRAM read control part 51 of the IBUF manager 5 and the arithmetic part 7. The SRAM read control part 51 reads N FM data from the N IBUFs (0 to N−1) and transmits them to the arithmetic part 7.

Figure 17:
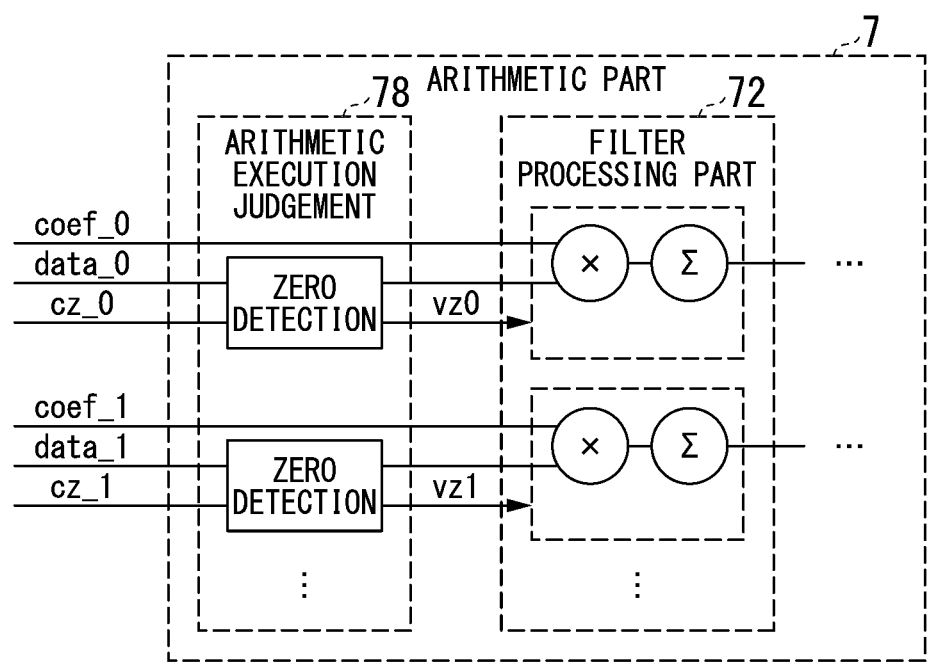
FIG. 17 is a diagram showing an internal configuration of the arithmetic part in the arithmetic processing device according to the third modification of the embodiment of the present invention.

FIG. 17 is a diagram showing the internal configuration of the arithmetic part 7 in the present modification. The arithmetic execution determination part 78 of the arithmetic part 7 detects a portion where the FM data (data_0, data_1, . . . ) transmitted from the IBUF manager 5 is zero and uses the logical sum of the detection result and the coefficient zero detection signal (cz_0, cz_1, . . . ) transmitted from the coefficient zero detection part 53 is used as a arithmetic through signal (vz0, vz1, . . . ). In the case of this modification, FM data may be input even if the coefficient is zero, but the arithmetic execution determination part 78 can confirm that the coefficient zero detection signals (cz_0, cz_1, . . . ) are zero, so the filter processing part 72 does not operate after all.

Figure 18:
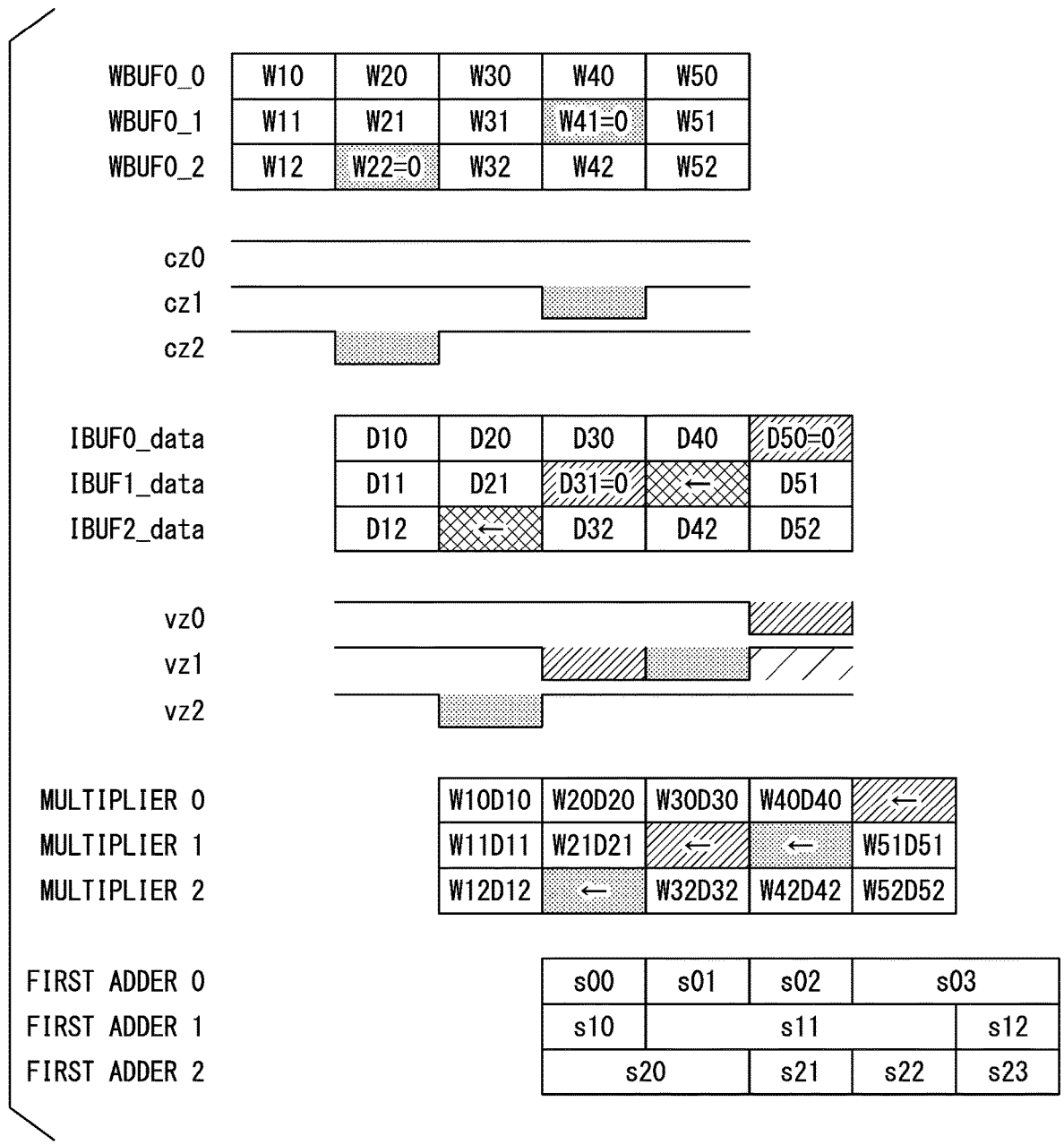
FIG. 18 is a diagram showing a timing chart at the time of arithmetic in the arithmetic processing device according to the third modified example of the embodiment of the present invention.

FIG. 18 is a diagram showing a timing chart at the time of arithmetic in the present modification. In a case in which the values (W) of all the M parallel coefficients in WBUF (coefficient storage memory) are zero, the coefficient zero detection signals (cz_0, cz_1, . . . ) become zero, and reading of FM data from the corresponding IBUF is not performed ("←" in the figure). Then, in a case in which the arithmetic through signal (vz0, vz1, . . . ) based on the detection result of zero in the data value (D) in IBUF (data storage memory) and the detection result of zero in the coefficient value (W) in WBUF (coefficient storage memory) is zero, the arithmetic in the multiplier 73 of the filter processing part 72 is passed through ("←" in the figure). The final result obtained is the same as that of the first modification.

As described above, in the present modification, the coefficient zero detection part 53 of the IBUF manager 5, which is M parallel, detects whether or not all M parallel coefficients (M coefficients) among N×M coefficients stored in WBUF (coefficient storage memory) are zero, and outputs a coefficient zero detection signal (cz*). Then, the SRAM read control part 51 of the IBUF manager 5 extracts the FM data only from the IBUF (data storage memory) corresponding to the coefficient whose zero coefficient detection signal (cz*) is not zero. The arithmetic execution determination part 78 detects a zero portion in the FM data, and outputs the logical sum of the detection result and the result of the coefficient zero detection part 53.

With such a configuration, in the third modification, in addition to the first modification, in a case in which all the coefficients in M parallel are zero, access to the SRAM itself is stopped. Thereby, the power consumption can be further reduced. The third modification is advantageous when there are many zero coefficients.

(Arrangement of FM Data in DRAM)

Generally, the image data is expanded in a rectangular form (or a form similar thereto) on the DRAM so that it can be easily associated with the image. Even in image recognition by deep learning using a CNN, since the FM to be handled has two-dimensional position information, it is easy to understand if FM data is arranged on the DRAM like image data.

Figure 19:
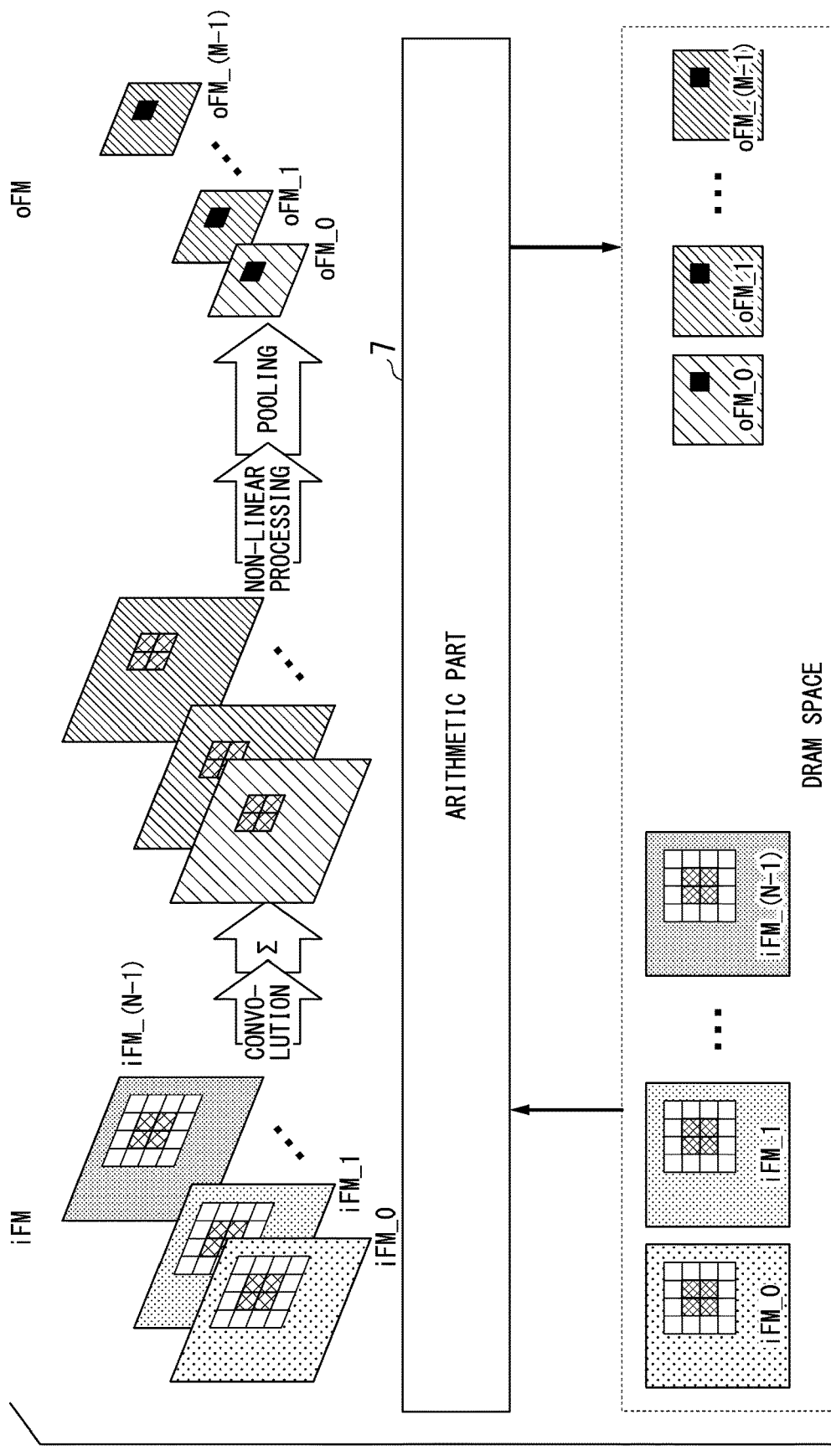
FIG. 19 is an image diagram of arranging FM data to be processed by a CNN in the DRAM space.

FIG. 19 is an image diagram of arranging FM data to be processed by a CNN in the DRAM space. iFM_0 to iFM_(N−1), which are iFM data, are arranged in a rectangular (horizontal arrangement) in the DRAM space in units of FM.

The arithmetic part 7 reads iFM data from the DRAM, performs CNN processing such as convolution processing, addition processing, non-linear processing, and pooling processing and writes the obtained oFM data in the DRAM. The oFM_o to oFM_(M−1), which are oFM data, are also arranged in the DRAM space in a rectangular shape (side by side) in units of FM.

The FM handled by the CNN is a high-dimensional data string of hundreds to thousands, and in a case in which the FMs are rectangularly arranged in the DRAM space in units of FM, the DRAM addresses are scattered as shown in FIG. 19, and DRAM transfer efficiency drops.

Figure 20:
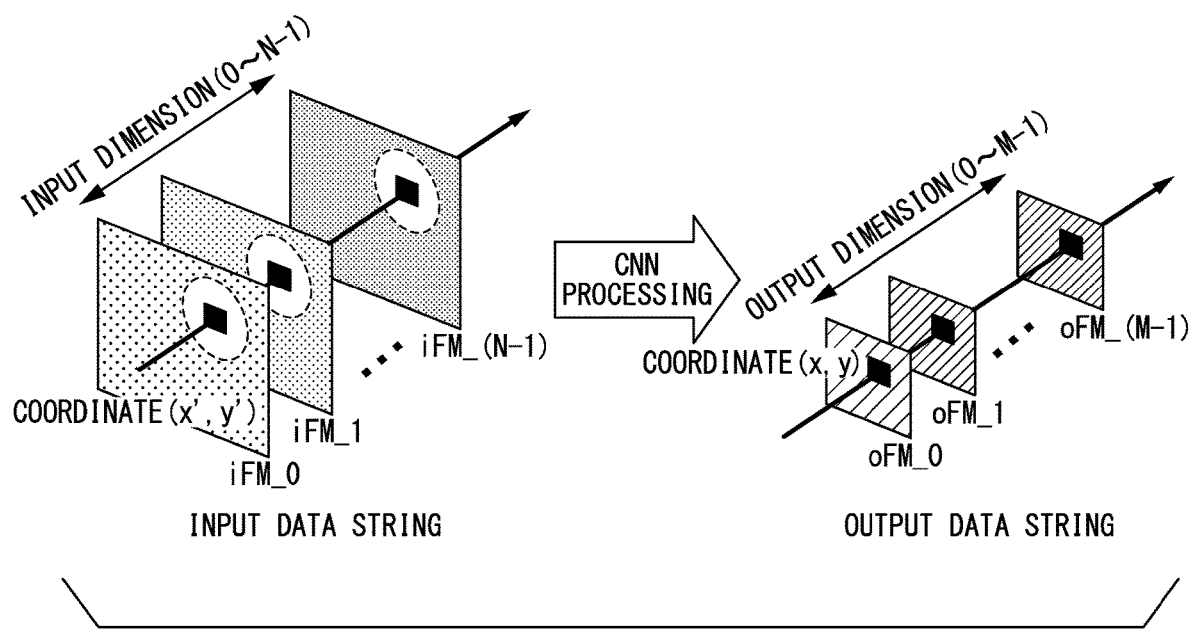
FIG. 20 is an image diagram showing a relationship between an input data string and an output data string in a CNN processing.

FIG. 20 is an image diagram showing the relationship between the input data string and the output data string the CNN processing. The input data string (iFM data) has N dimensions (0th to (N−1)th order), and the output data (oFM data) after CNN processing has M dimensions (0th to (M−1)th order). In the input/output data of the CNN processing, the input data required to calculate the M-dimensional information at the coordinates (x, y) of the output data is all N-dimensional information (with a certain spread) in the vicinity of the coordinates (x', y') of the input data. That is, CNN processing is performed using the data in the area surrounded by the circle centered on the coordinates (x', y') of the input data shown in FIG. 20, and the M-dimensional data at the coordinates (x, y) of the output data is calculated. In addition, although a coefficient is actually required for the CNN processing, it is omitted here.

In this way, the arithmetic is performed using the data of the same coordinates on the line of the arrow shown in FIG. 20. Therefore, in the CNN processing, it is desirable that data can be expanded so that the DRAM can be accessed in units of coordinates. Further, a special processing such as a shortcut processing described below may exist in the CNN, and it is important to be able to access the DRAM in units of coordinates in order to deal with such a special processing.

(Shortcut Processing)

Figure 21:
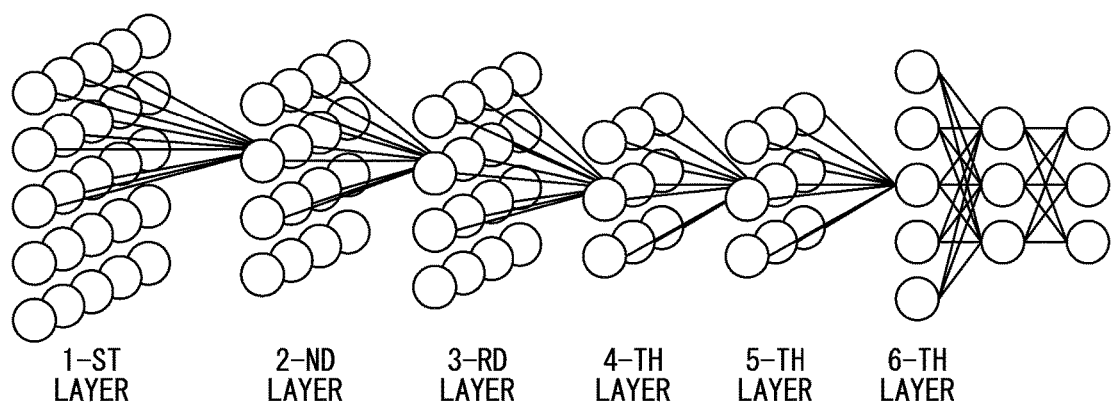
FIG. 21 is an image diagram showing a normal CNN processing.
Figure 22:
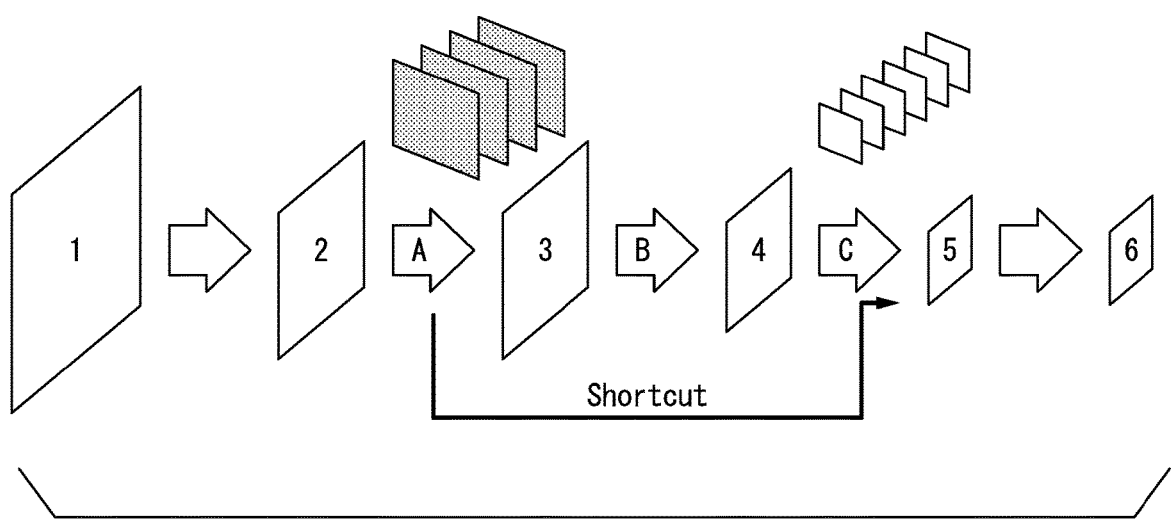
FIG. 22 is an image diagram showing an example of a relocate processing, which is a type of shortcut processing.

Here, the shortcut processing will be described. FIG. 21 is an image diagram showing a normal CNN processing, and FIG. 22 is an image diagram showing an example of the shortcut processing. In normal CNN processing, CNN processing is performed between two layers, and there is an input/output relationship between the immediately preceding layer and the immediately following layer as shown by the straight line between the two layers shown in FIG. 21. The CNN processing is performed by using the output FM of the immediately preceding layer as an input, and the result of the CNN processing becomes the input FM of the immediately following layer.

There may be a shortcut processing depending on the adopted network. In the shortcut processing, there is an input/output relationship with a layer ahead (skipping) of one or more layers. FIG. 22 shows an example of a Relocate processing, which is a type of shortcut processing, in which shortcut is performed to skip the third and fourth layers. That is, part or all of the output FM of the second layer (arrow A in FIG. 22) becomes the input FM of the fifth layer by shortcut. However, some of the inputs on the fifth layer include FMs (FMs that have passed through arrows B and C in FIG. 22) that have passed through normal paths (that is, the third and fourth layers). That is, the sum of the FMs passing through the normal path and the FMs passing through the shortcut path is input to the fifth layer.

Each layer of the CNN may include a pooling processing that is a reduction processing, and in this case, the size of the data passing through the shortcut path and the size of the data passing through the normal path are different. Note that the pooling processing may not be included depending on the layer. In the example of FIG. 22, the second layer processing, the fourth layer processing, and the fifth layer processing include the pooling processing, and the size of the FM is reduced. On the other hand, the pooling processing is not included in the third layer processing and the sixth layer processing, and the size of the FM is not reduced.

Figure 23:
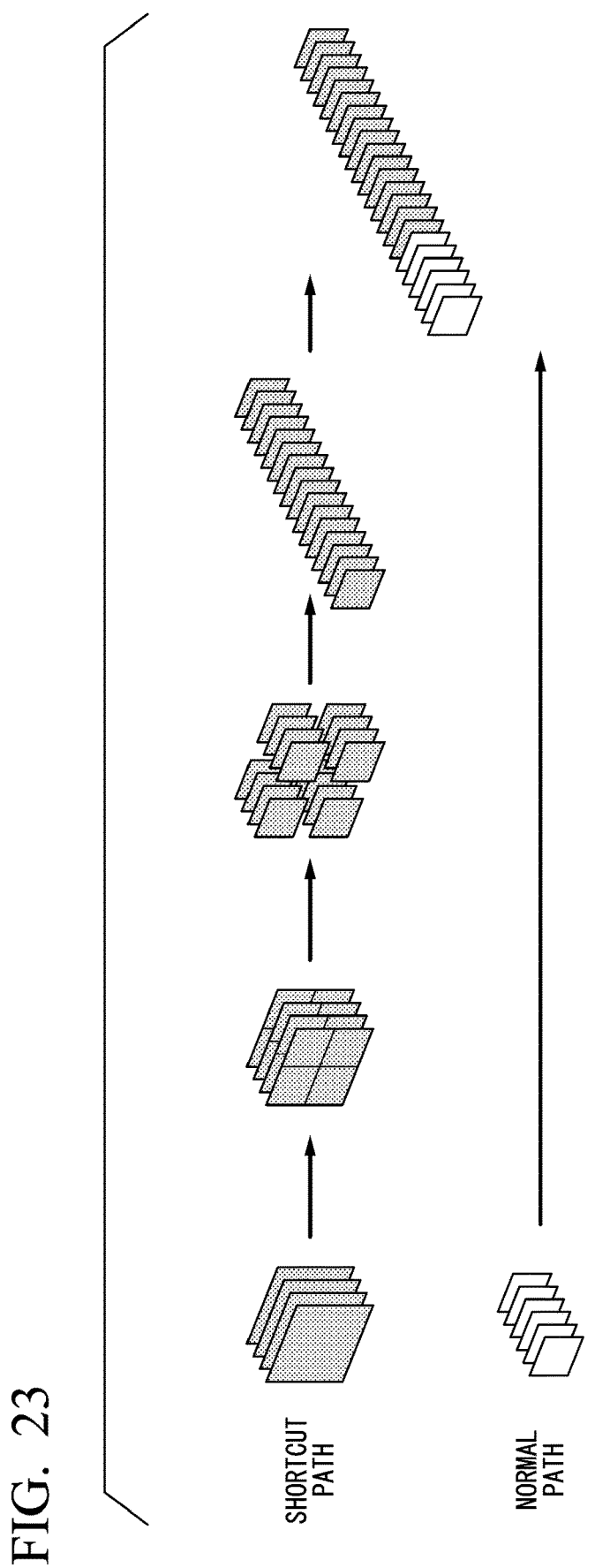
FIG. 23 is an image diagram showing an example of handling the iFM at the shortcut destination in the relocate processing of FIG. 22.

Consider a case where the size of data passing through the shortcut path and the size of data passing through the normal path are different. FIG. 23 is an image diagram showing an example of handling the iFM at the shortcut destination in the relocate processing of FIG. 22. Specifically, it shows an example of handling the iFM in the processing of the fifth layer, which is the destination of shortcut, when the size of the FM passing through the shortcut path is twice both vertically and horizontally of the size of the FM passing through the normal path.

As shown in FIG. 23, the FM passing through the shortcut path is vertically and horizontally divided into four, and each of the divided FMs is regarded as a one plane of FM. As a result, the size of the FM formed by dividing the FM that has passed through the shortcut path and the size of the FM that has passed through the normal path become the same. Then, the sum of the FM formed by dividing the FM that has passed the shortcut path and the FM that has passed the normal path (oFM of the fourth layer) becomes the iFM of the fifth layer. Here, the number of dimensions of the FM satisfies the following relationship, except for the two dimensions indicating the position.

fifth layer input dimension number=(second layer shortcut path output dimension number)×4+ (fourth layer output dimension number)

As described above, the shortcut processing is a characteristic process that is not present in other image processes in that information that has different coordinates at the time of input is treated as different dimensional information having the same coordinates. There are many ways to handle the FM in the fifth layer via the shortcut path, and FIG. 23 is only an example.

Figure 24:
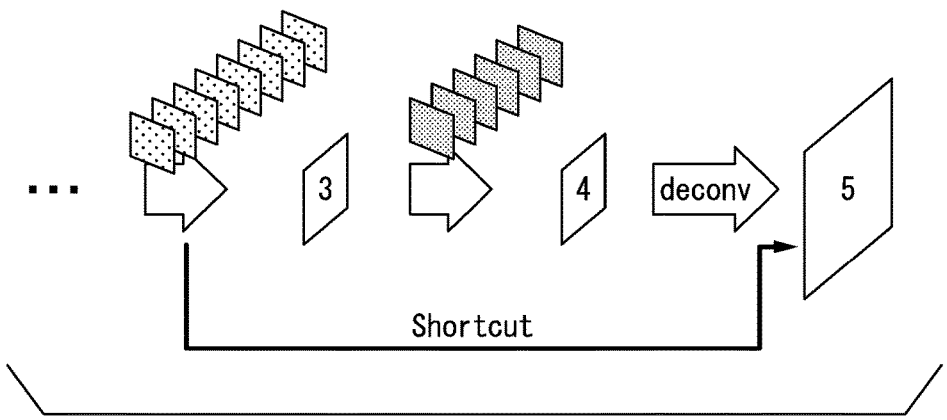
FIG. 24 is an image diagram showing an example of a combine processing, which is a type of shortcut processing.

The Relocate processing, which is a type of shortcut processing, has been described above. However, depending on the network, there may be a processing in which small FMs are connected into a plurality of planes and treated as a large FM of one plane (hereinafter referred to as a combine processing). FIG. 24 is an image diagram showing an example of a combine processing, which is a type of shortcut processing. As in FIG. 22, the third and fourth layers are skipped and short cut is performed, but a plurality of planes of small FMs are combined to form a large FM of one plane, which is used as the fifth iFM.

Figure 25:
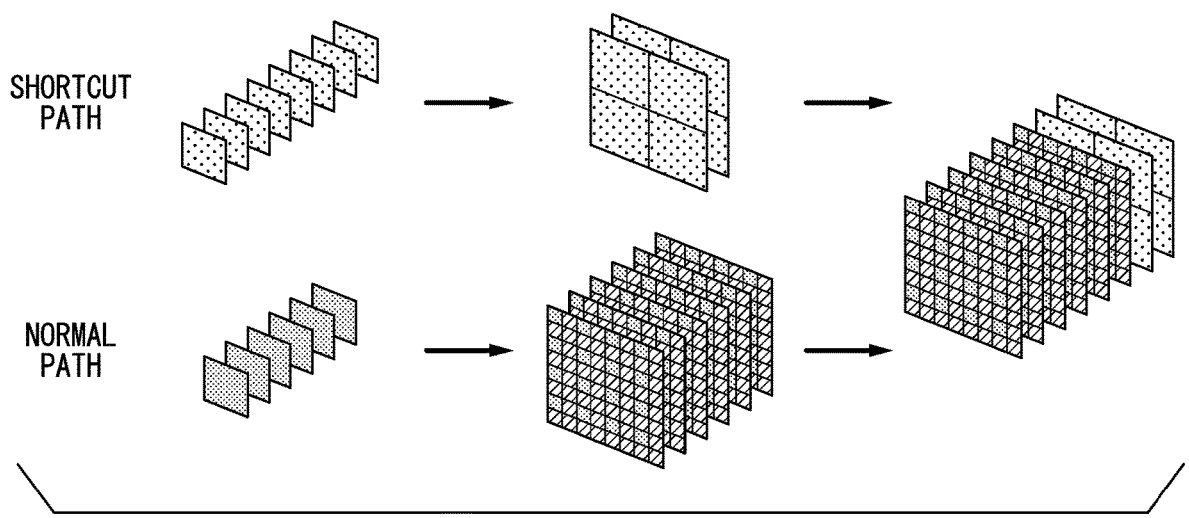
FIG. 25 is an image diagram showing an example of handling an iFM at a shortcut destination in a combine processing.

FIG. 25 is an image diagram showing an example of handling the iFM at the shortcut destination in the combine processing. Specifically, it shows an example of handling the iFM in the processing of the fifth layer of FIG. 24, which is the destination of the shortcut, in a case in which the size of the FM passing through the shortcut path is ½ both vertically and horizontally of the iFM size of the fifth layer in FIG. 24 and the size of the FM passing through the normal path is ⅛ both vertically and horizontally of the iFM size of the fifth layer in FIG. 24.

As shown in FIG. 25, FMs that have passed through the shortcut path are combined in a 2×2 plane to generate a large FM of one plane. Further, FM (effective pixels) and invalid pixels that have passed through a normal path are alternately arranged and combined in 88 planes to generate a large FM of one plane. As a result, the size of the FM passing through the shortcut path becomes the same as the size of the FM passing through the normal path. The sum of the FM (large FM) that has passed the shortcut path and the FM that has passed the normal path (the FM that has passed the normal path and the large FM generated from the invalid pixels) is the fifth layer iFM of FIG. 24.

In the case of the combine processing, the data that has passed through the shortcut path can be dealt with by simply writing the data so that the data is adjacent to each other on the DRAM at the time of FM output, and thus can be realized without requiring a special circuit configuration. The data that has passed through the normal path needs to be enlarged, and there is a method called "padding data" that fills the invalid pixel with a pixel of a certain value. Other methods include interpolation from surrounding pixels. In a case in which the padding data is used, the IBUF read control part may generate and output the padding data without accessing the SRAM, so that it can be realized without any special circuit configuration.

(Method of Arranging Data in DRAM)

A method for efficiently arranging, transferring, and processing data having the above-described input/output relationship on the DRAM will be described. Since the problem relates to handling of a high-dimensional data string that is not limited to deep learning, the following description will be made as general as possible.

The correspondence relationship with the term deep learning is as follows.

"Input data (column)"="iFM (input feature map)"
"Output data (column)"="oFM (output feature map)"
"Input dimension"="iFM number"
"Output dimension"="oFM number"

The data format will be described. For simplicity of illustration and description, it is assumed that the input data is a four-dimensional data string having two-dimensional position information and its size is 30×30 pixels. Further, it is assumed that the number of dimensions that can be transferred by one burst transfer for one pixel is four.

Figure 26:
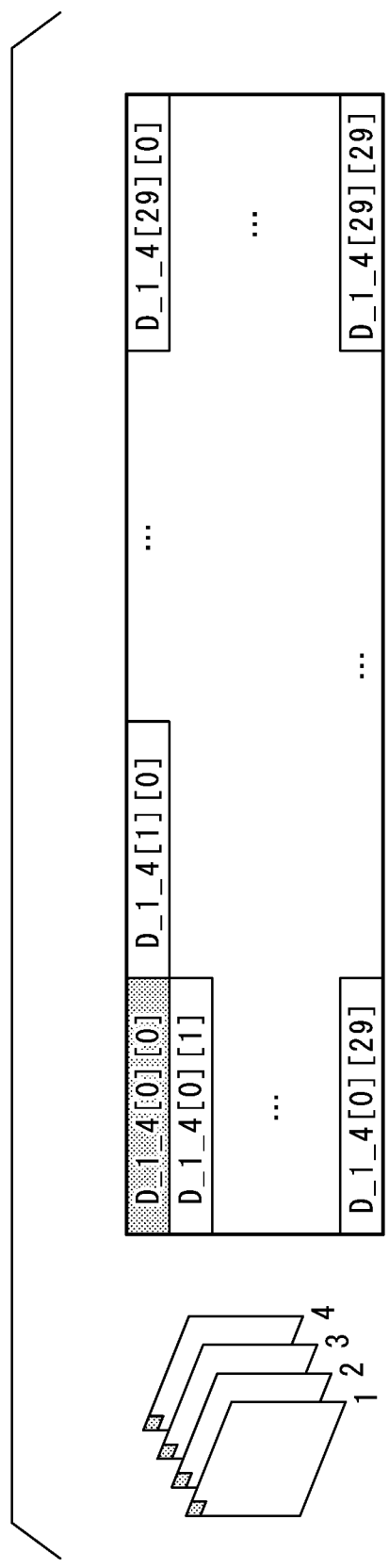
FIG. 26 is an image diagram of a high-dimensional data string arranged on the DRAM.

FIG. 26 is an image diagram of a high-dimensional data string arranged on the DRAM. The symbol "D_a_b[X][Y]" is defined as bit-connected a-th to b-th data at the coordinate position (X, Y). That is, in FIG. 26, the data obtained by bit-connecting the 1st to 4th data at each of the coordinate positions (0, 0) to (29, 29)(data surrounded by one frame in FIG. 26) are arranged in order from the top left of the DRAM.

Since the number of dimensions that can be transferred by one burst transfer is 4, it becomes exactly one burst transfer (one burst) when ba+1=4. Therefore, the data surrounded by one fame in FIG. 26 is exactly one burst. By arranging the data on the DRAM in this way, it is possible to efficiently arrange, transfer, and acquire the data in units of coordinate.

Figure 27:
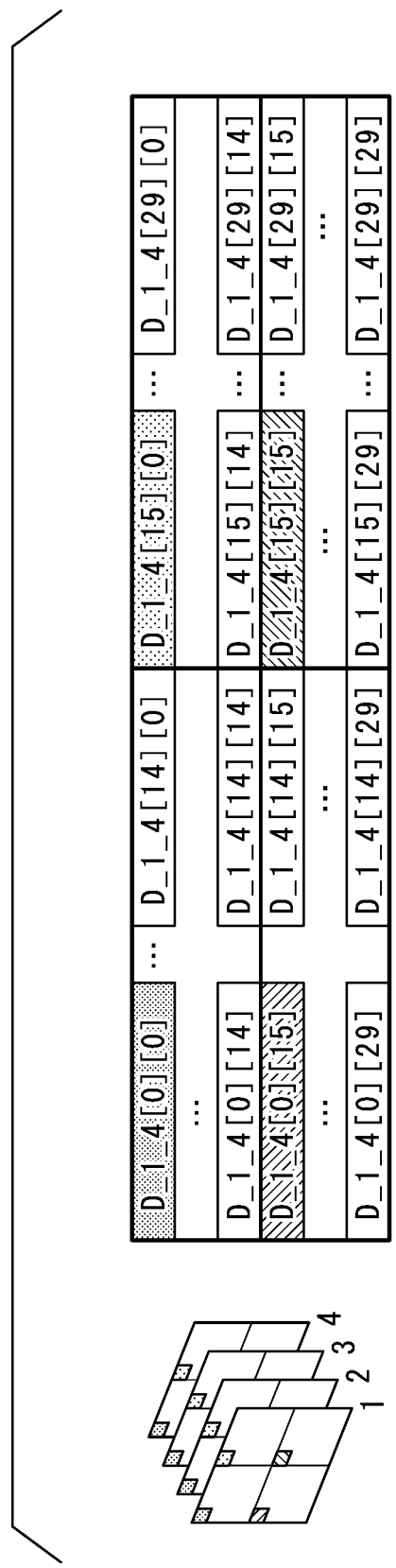
FIG. 27 is an image diagram of a high-dimensional data string arranged on the DRAM when the high-dimensional data string is divided and handled.

FIG. 27 is an image diagram of a high-dimensional data string arranged on the DRAM in a case in which the high-dimensional data string is divided and handled. Specifically, the input data string arranged on the DRAM is divided into upper, lower, left, and right (into four parts), and each of the divided data strings is treated as individual data of size 15×15. As a result, data can be arranged, transferred, and acquired without reducing efficiency.

Figure 28A:
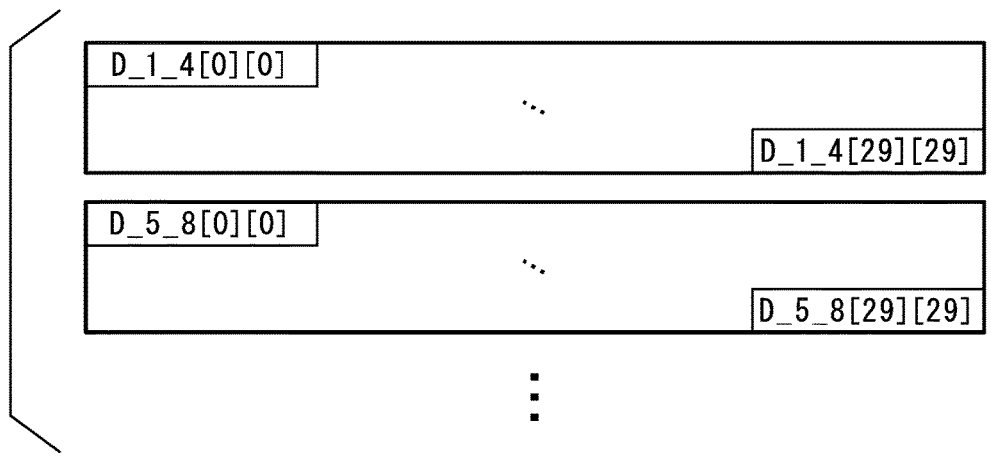
FIGS. 28A and 28B are image diagrams of a high-dimensional data string arranged on a DRAM when data of the same coordinate extends over a plurality of burst transfers.
Figure 28B:
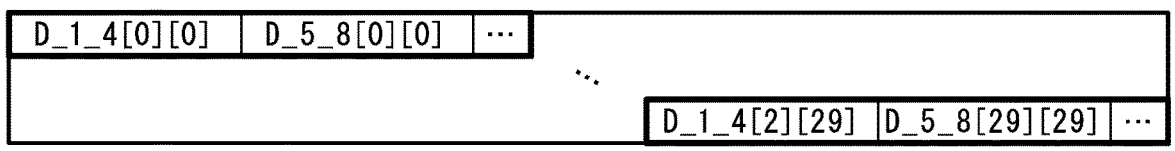

When handling a higher-dimensional data string, since data of the same coordinate cannot fit in one burst transfer unit, access control is performed so that one coordinate corresponds to a plurality of burst transfers. FIGS. 28A and 28B are image diagrams of a high-dimensional data string arranged on the DRAM when the data of the same coordinate spans a plurality of burst transfers. Specifically, since the first to eighth data of the same coordinates cannot fit in one burst transfer unit, the bit-connected data of the first to fourth data and the bit-connected data of the fifth to eighth data are separately arranged on the DRAM. That is, the bit-connected data of the first to fourth data and the bit-connected data of the fifth to eighth data at each of coordinate positions (0, 0) to (29, 29) are arranged on the DRAM.

FIG. 28A is an example in which data of the same coordinate is divided and arranged in a plurality of rectangular areas. The bit-connected data of the first to fourth data, the bit-connected data of the fifth to eighth data, and so on at each of the coordinate positions (0, 0) to (29, 29) are arranged separately in a rectangular area.

FIG. 28B is an example in which data of the same coordinates are placed and arranged at consecutive addresses. The bit-connected data of the first to fourth data, the bit-connected data of the fifth to eighth data, and so on at each of the coordinate positions (0, 0) to (29, 29) are arranged at consecutive addresses.

The same coordinate data may be divided into a plurality of rectangular areas as shown in FIG. 28A, or the same coordinate data may be arranged at consecutive addresses as shown in FIG. 28B. Reading and writing can be performed according to the arrangement.

As described above, in order to efficiently perform the shortcut processing that combines inputs from a plurality of layers having different FM sizes and the number of dimensions, it is essential to store data that can be burst-transferred in units of coordinate. By using the burst transfer when transferring the high-dimensional data string to the DRAM or transferring it from the DRAM, it is possible to prevent the transfer efficiency from decreasing.

(Circuit Configuration)

Next, a circuit configuration for handling data in the above format will be described. In order to simplify the explanation here as well, it is assumed that the number of dimensions of the input data is 16. The overall configuration of the arithmetic processing device for handling the data in the above format is the same as in FIG. 2.

A DRAM (external storage memory) 9 is a large-capacity memory that stores a high-dimensional data string. Here, the high-dimensional data string is a data string having one or more dimensional position information and higher-order elements at that position. Then, as described above, the same coordinates of the high-dimensional data string are arranged so that they can be acquired by one or more burst transfers.

In the case of deep learning, the high-dimensional data string stored in the external storage memory is a feature map having coordinate information of dimensions and a higher-order feature amount for each coordinate, and the data amount corresponding to one coordinate is one unit or more of the burst transfer amount.

The data input part 3 acquires a high-dimensional data string from the DRAM 9 by burst transfer, and transfers the acquired high-dimensional data string to the IBUF (data storage memory) manager 5.

In the case of deep learning, the data input part 3 calculates a read address to access the DRAM 9 based on the number of faces and coordinates of the input feature map, acquires a high-dimensional data string (iFM) from the DRAM 9 by burst transfer, and transfers the acquired high-dimensional data string to the IBUF manager.

Figure 29:
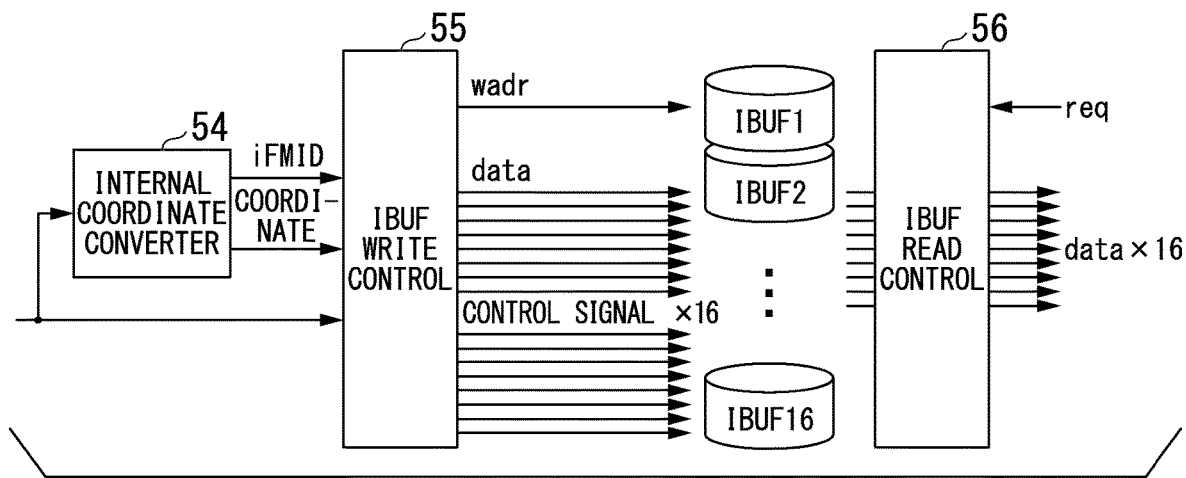
FIG. 29 is a block diagram showing a configuration of an IBUF manager.

FIG. 29 is a block diagram showing the configuration of the IBUF manager 5 for handling the above-described format data. The IBUF manager 5 includes an internal coordinate conversion part 54, an IBUF write control part 55, an IBUF read control part 56, and IBUF1 to IBUF16.

The internal coordinate conversion part 54 generates a coordinate and an ID (supplemental information) to be handled by the arithmetic part 7 by counting the high-dimensional data string acquired by the data input part 3 from the DRAM 9 by a predetermined method.

In the case of deep learning, the internal coordinate conversion part 54 generates the ID (iFMID) and coordinates of the feature map.

Since the number of dimensions of data that can be acquired by one burst transfer is 4, 16-dimensional data can be acquired by four burst transfers. Therefore, the value of ID is changed so as to cycle through 0, 1, 2, and 3.

The IBUF write control part 55 generates a write control signal for IBUF based on the generated coordinates. At that time, a write control signal to the IBUF is generated as follows according to the value of the ID.

ID=0: The input is the first to fourth data, and is stored in IBUF1 to IBUF4.
ID=1: The input is the fifth to eighth data, and is stored in IBUF5 to IBUF8.
ID=2: The input is the ninth to twelfth data, and is stored in IBUF9 to IBUF12.
ID=3: The input is the thirteenth to sixteenth data, and is stored in IBUF13 to IBUF16.

In the case of deep learning, the IBUF write control part generates a write control signal and a write address for the write target data storage memory based on the ID (iFMID) and coordinates of the feature map. In this way, by converting the data acquired from the DRAM into the handling standard in the arithmetic part (which number of the input FM and which coordinate corresponds to) and appropriately writing it in the IBUF, the CNN process in the arithmetic part ca be performed.

Figure 30:
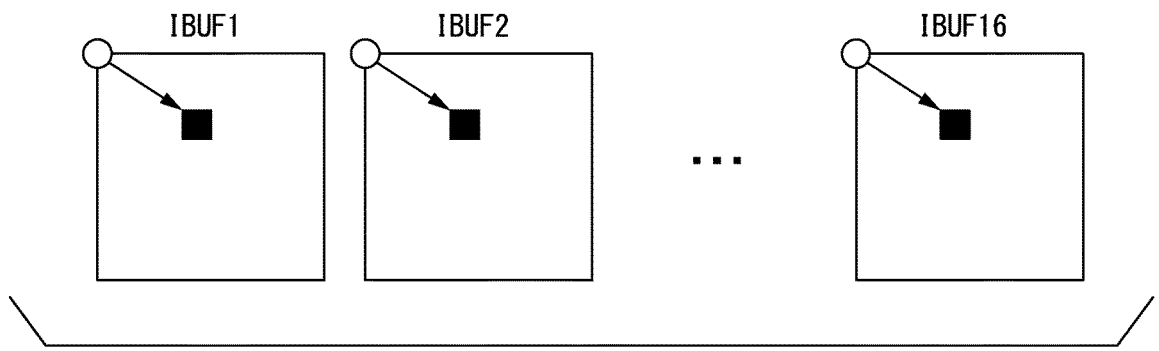
FIG. 30 is a diagram showing an image in the IBUF.

FIG. 30 is an image diagram inside the IBUF. Since the write address is obtained from the coordinates, the same address of each IBUF stores data of different dimensions with the same coordinates, as shown in FIG. 30.

The IBUF read control part 56 receives the request from the arithmetic part 7 and accesses the necessary data from the IBUF in a predetermined order. The arithmetic part 7 performs a predetermined data process using this data. Then, the data output part 8 collectively outputs the data of the same coordinates output from the arithmetic part 7 as a high-dimensional data string in units of burst transfer.

In the case of deep learning, the data output part 8 calculates a write address for accessing the DRAM 9 based on the number of faces and coordinates of the output feature map, and outputs the data to the DRAM 9 by burst transfer.

Figure 31:
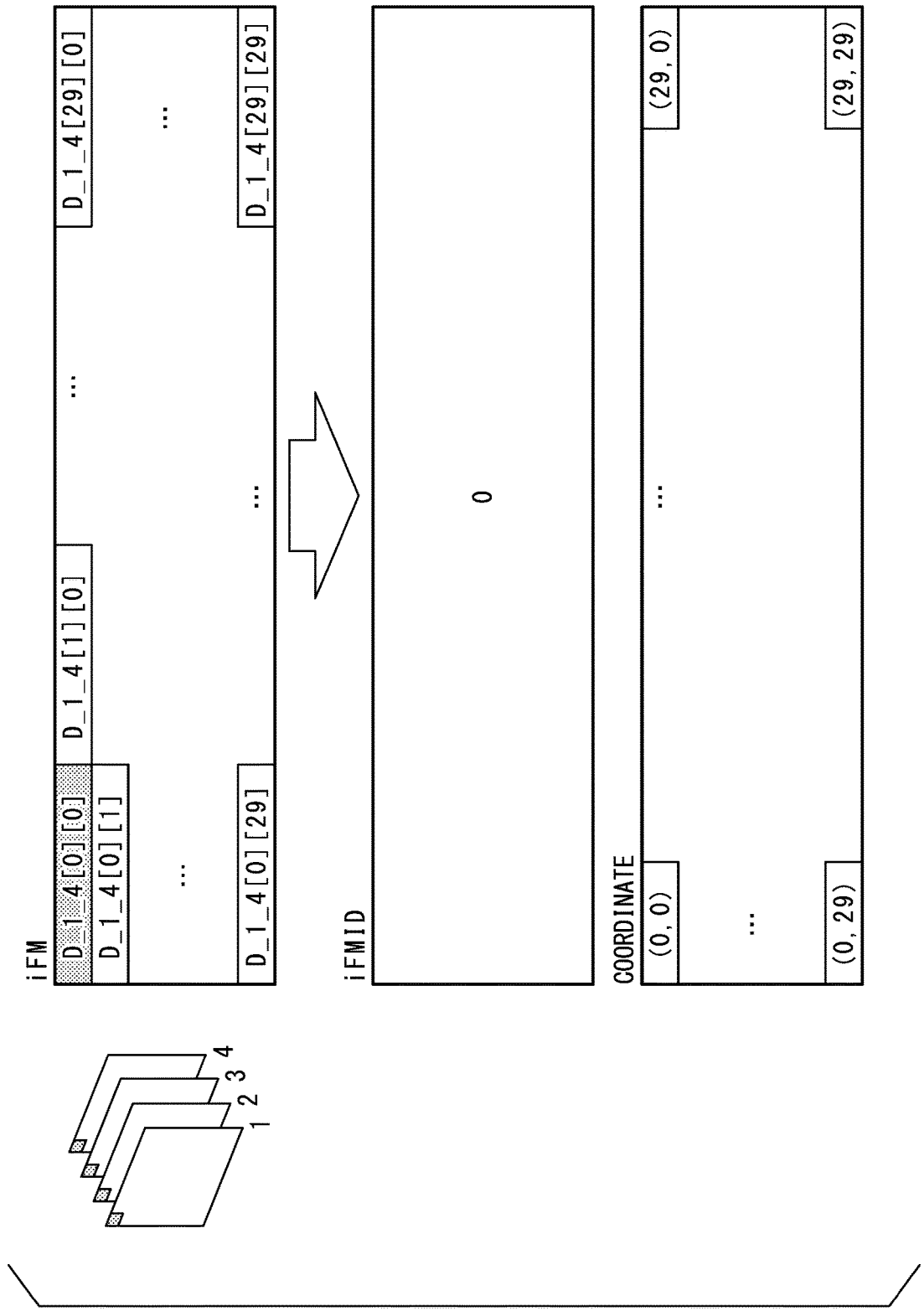
FIG. 31 is a diagram showing processing of an internal coordinate conversion part in normal processing.

Next, an operation example of the internal coordinate conversion part 54 will be described. As a first example, the process of the internal coordinate conversion part 54 in the normal process will be described. FIG. 31 is a diagram showing the processing of the internal coordinate conversion part in the normal processing, and shows how the coordinates and iFMID are generated from the iFM shown in FIG. 26. The iFMID is always 0, and the coordinates remain as in the iFM image. Since iFMID is 0, all data is stored in IBUF1 to IBUF4.

In this case, since the IBUF5 to 16 are not used, four IBUF may be used as one IBUF without waste, as IBUF1 to 4 are equivalent to IBUF1, IBUF5 to 8 are equivalent to IBUF2. IBUF9 to 12 are equivalent to IBUF3, and IBUF13 to 16 are equivalent to IBUF4.

Figure 32:
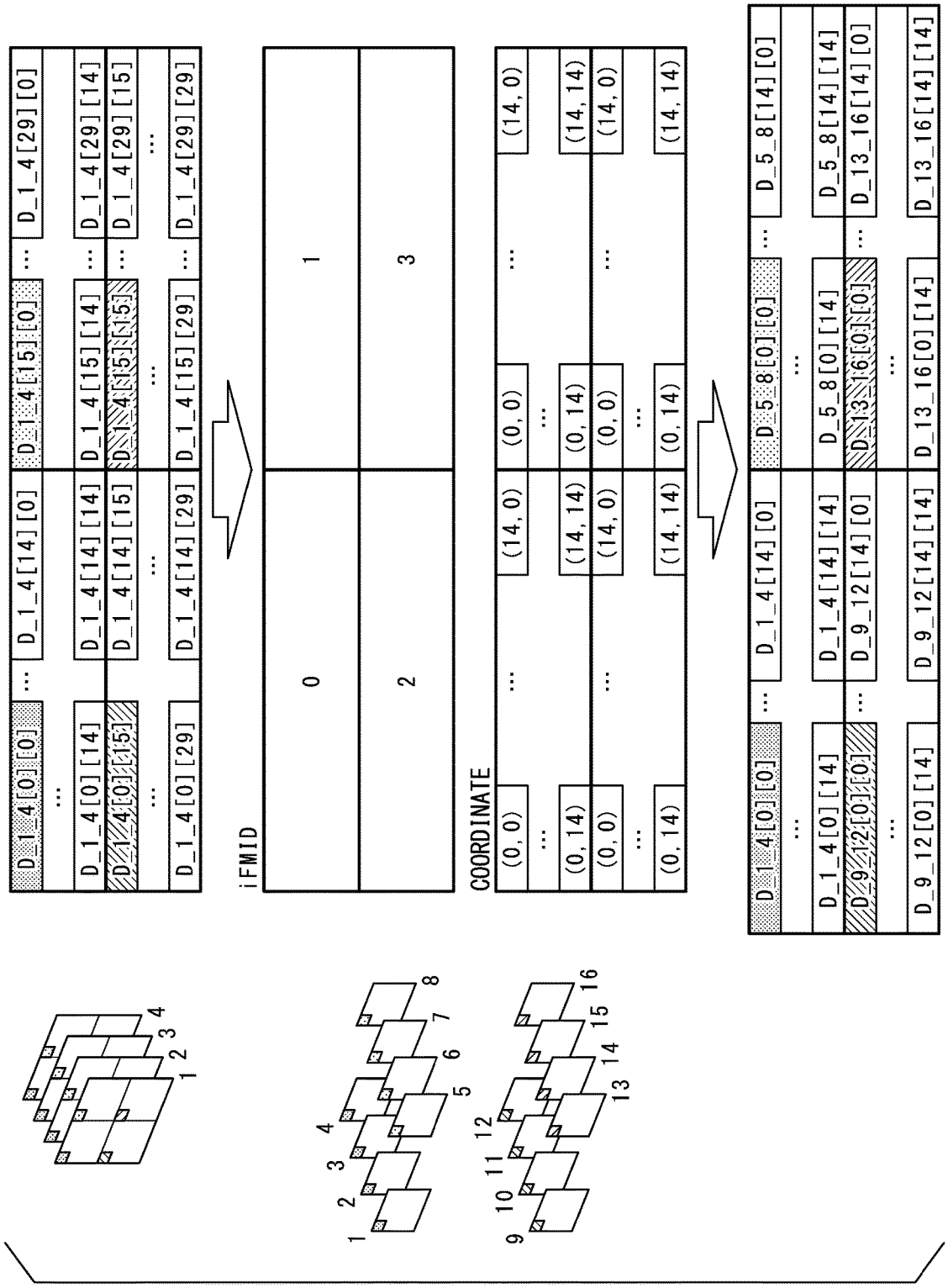
FIG. 32 is a diagram showing processing of an internal coordinate conversion part in shortcut processing.

As a second example, the processing of the internal coordinate conversion part 54 in the shortcut processing will be described. FIG. 32 is a diagram showing the processing of the internal coordinate conversion part in the shortcut processing, and shows how the coordinates and iFMID are generated from the iFM shown in FIG. 27 and written to the IBUF.

The iFMID is set to different values vertically and horizontally in the FM, and the coordinates are assigned with the upper left corner as the origin in each iFMID area. As a result, the data shown in the bottom of FIG. 32 is obtained, and is written in IBUF as follows.

Data in the area of iFMID=0 are stored in IBUF1 to 4.
Data in the area of iFMID=1 are stored in BUF5-8.
Data in the area of iFMID=2 are stored in IBUF9 to 12.
Data in the area of iFMID=3 are stored in IBUF13 to 16.

Although there are many methods of converting to coordinates and generating IDs, the simplest example is to convert and generate by counting the number of valid data when the input is stream input in raster scan.

In the above description, IBUF is shown as an image of another SRAM for each dimension. However, one (or a plurality) of SRAMs may be virtually divided to store a plurality of dimensional data in a single SRAM.

Although one embodiment of the present invention has been described above, the technical scope of the present invention is not limited to the above embodiment. The combination of components can be changed, various changes can be made to each component, and the components can be deleted without departing from the spirit of the present invention.

Each component is for explaining a function or a process related to each component. A single configuration (circuit) may simultaneously realize the functions and processes related to a plurality of components.

Each component may be realized individually or as a whole by a computer including one or more processors, a logic circuit, a memory, an input/output interface, and a computer-readable recording medium. In that case, a program for realizing each component or the entire function may be recorded in a recording medium, and the recorded program may be read into a computer system and executed to realize the various functions and processes described above.

In this case, for example, the processor is at least one of a CPU, a DSP (Digital Signal Processor), and a GPU (Graphics Processing part). For example, the logic circuit is at least one of an ASIC (Application Specific Integrated Circuit) and an FPGA (Field-Programmable Gate Array).

The "computer system" here may include an OS and hardware such as peripheral devices. Further, the "computer system" also includes a homepage providing environment (or display environment) in a case in which a WWW system is used. Further, the "computer-readable recording medium" means a writable nonvolatile memory such as a flexible disk, a magneto-optical disk, a ROM, a flash memory, a portable medium such as a CD-ROM, a storage device such as a hard disk built in a computer system, or the like.

Further, the "computer-readable recording medium" includes a volatile memory that holds a program for a certain period of time inside a computer system (for example, a DRAM (dynamic random access memory)) which serves as a server or a client when a program is transmitted via a network such as the Internet or a communication line such as a telephone line.

Further, the program may be transmitted from a computer system in which the program is stored in a storage device or the like to another computer system via a transmission medium or by a transmission wave in the transmission medium. Here, the "transmission medium" for transmitting the program refers to a medium having a function of transmitting information, such as a network (communication network) such as the Internet or a communication line such as a telephone line. Further, the program may be for realizing part of the functions described above. Further, it may be a so-called difference file (difference program) that realizes the functions described above in combination with a program already recorded in the computer system.

The present invention can be widely applied to an arithmetic processing device that performs deep learning using a convolutional neural network, and can perform convolution processing and full-connect processing in a common circuit. Furthermore, it is possible to support the shortcut processing and maintain high DRAM transfer efficiency.

What is claimed is:

1. An arithmetic processing device that performs image recognition on image data included in input feature map data using deep learning, which performs a convolution processing and a full-connect processing, comprising:
    a data storage memory manager including a data storage memory configured to store input feature map data, and a data storage memory control circuit configured to control the data storage memory;
    a coefficient storage memory manager including a coefficient storage memory configured to store a coefficient, and a coefficient storage memory control circuit configured to controls the coefficient storage memory;
    a data input part configured to acquire the input feature map data from an external storage memory;
    a coefficient input part configured to acquire the coefficient from the external storage memory;
    a data output part configured to write output feature map data to the external storage memory;
    an arithmetic part configured to acquire, with a configuration of N parallel inputs and M parallel outputs (N, M≥1), the input feature map data from the data storage memory and the coefficient from the coefficient storage memory, to perform filter processing, cumulative addition processing, non-linear arithmetic processing, and pooling processing; and
    a controller configured to control the data storage memory manager, the coefficient storage memory manager, the data input part, the data output part, and the arithmetic part,
    wherein the data storage memory manager acquires the input feature map data from the data storage memory,
    the coefficient storage memory manager refers to a status of the data storage memory manager, to acquire a coefficient corresponding to data, which is to be acquired from the data storage memory manager, from the coefficient storage memory,
    the data output part connects M parallel data output from the arithmetic part to output to the external storage memory,
    the arithmetic part includes:
        a filter processing part having a multiplier and a first adder configured to perform the filter processing;
        a second adder configured to perform the cumulative addition processing that cumulatively adds all results of the filter processing as executed in N parallels;
        a non-linear conversion part configured to perform the non-linear arithmetic processing on result of the cumulative addition processing;
        a pooling processing part configured to perform the pooling processing on result of the non-linear arithmetic processing; and
    an arithmetic control part configured to control the filter processing part, the second adder, the non-linear conversion part, and the pooling processing part,
    the arithmetic control part, during the full-connect process,
        controls the arithmetic part to perform a process of converting an input one-dimensional data string (the number of elements is n) into a data string of N faces of a predetermined size (Fx×Fy) (where n≤Fx×Fy×N, at least one of Fx and Fy is 2 or more),
        sets a filter size to the predetermined size (Fx×Fy), and
        controls the arithmetic part so that a size of the output feature map data is 1×1 and the number of elements is m, as an output one-dimensional data string (the number of elements is m), wherein the output feature map includes image recognition results of objects included in the image data.

2. The arithmetic processing device according to claim 1, wherein the data storage memory includes a buffer that stores a data set necessary for calculating one data after the pooling process, and the buffer stores the data read from the data storage memory.

3. The arithmetic processing device according to claim 1, wherein,
    in a state in which at least one of the input feature map data and the coefficient input is zero, an arithmetic execution determination part notifies the filter processing part of an arithmetic through, and
    in a state in which the arithmetic execution determination part notifies the arithmetic through, the filter processing part stops arithmetic processing.

4. The arithmetic processing device according to claim 3, wherein
    the coefficient storage memory manager includes a data zero detection part configured to detect whether or not the input feature map data read from the data storage memory is zero,
    in coefficient storage memories, only a coefficient storage memory in which the input feature map data read from the corresponding data storage memory is not zero is accessed to acquire the coefficient, and
    the arithmetic execution determination part detects a portion where the coefficient is zero, and in a state in which logical sum of result thereof and result of the data zero detection part is zero, notifies the filter processing part of the arithmetic through.

5. The arithmetic processing device according to claim 3, wherein
    the data storage memory manager, which is N parallel, includes:
        a coefficient zero detection part configured to detect whether or not all N parallel coefficients are zero among N×M coefficients stored in the coefficient storage memory, to output a coefficient zero detection signal; and
        an SRAM read control part configured to acquire the input feature map data only from a data storage memory corresponding to a coefficient of which the coefficient zero detection signal is not zero among data storage memories,
    wherein the arithmetic execution determination part detects a portion where the input feature map data is zero, and in a state in which logical sum of result thereof and result of the coefficient zero detection part is zero, notifies the filter processing part of the arithmetic through.

6. The arithmetic processing device according to claim 1, wherein
   the external storage memory stores a high-dimensional data string that is a data string having one or more dimensional position information and higher-order elements at position thereof,
   the data input part acquires the high-dimensional data string from the external storage memory by burst transfer, and transfers the acquired high-dimensional data string to the data storage memory manager,
   the data output part collectively outputs data of the same coordinates output from the arithmetic part in a burst transfer unit as a high-dimensional data string,
   the data storage memory manager includes:
      an internal coordinate conversion part configured to convert the high-dimensional data string acquired by the data input part from the external storage memory into coordinates handled by the arithmetic part;
      a data storage memory write control part configured to generate a write control signal to the data storage memory based on the coordinates,
      the data storage memory; and
      a data storage memory read control part configured to receive necessary data from the data storage memory in a predetermined order in response to a request from the arithmetic part.

7. The arithmetic processing device according to claim 1, wherein
   the external storage memory stores a high-dimensional data string that is a data string having one or more dimensional position information and higher-order elements at position thereof,
   the high-dimensional data string stored in the external storage memory is a feature map having dimensional coordinate information and a higher-order feature amount for each coordinate, and data amount corresponding to one coordinate is one unit or more of a burst transfer amount,
   the data input part calculates a read address for accessing the external storage memory based on the number of faces and coordinates of the input feature map, and acquires a high-dimensional data string from the external storage memory by burst transfer, to transfer the acquired high-dimensional data string to the data storage memory manager,
   the data output part calculates a write address for accessing the external storage memory based on the number of faces and coordinates of the output feature map, and outputs data to the external storage memory by burst transfer,
   the data storage memory manager includes:
      an internal coordinate conversion part configured to generate coordinates and supplementary information; and
      a data storage memory write control part configured to generate a write control signal to the data storage memory based on the supplementary information,
   the internal coordinate conversion part counts the high-dimensional data string, which has been acquired from the external storage memory by the data input part, by a predetermined method, to generate the supplemental information and the coordinates of the feature map, and
   the data storage memory write control part generates a write control signal and a write address for a write target data storage memory based on the supplementary information and the coordinates of the feature map.

\* \* \* \* \*